(12) United States Patent
Fukunaka et al.

(10) Patent No.: US 10,943,894 B2
(45) Date of Patent: Mar. 9, 2021

(54) OPTICAL DEVICE HAVING LENS BLOCK HAVING RECESSED PORTION COVERING PHOTOELECTRIC CONVERSION BLOCK

(71) Applicant: ASAHI KASEI MICRODEVICES CORPORATION, Tokyo (JP)

(72) Inventors: Toshiaki Fukunaka, Tokyo (JP); Koji Matsushita, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/571,548

(22) Filed: Sep. 16, 2019

(65) Prior Publication Data

US 2020/0111769 A1    Apr. 9, 2020

(30) Foreign Application Priority Data

Oct. 5, 2018 (JP) .............................. JP2018-190129
Aug. 14, 2019 (JP) .............................. JP2019-148937

(51) Int. Cl.
*H01L 25/16* (2006.01)
*H01L 27/146* (2006.01)
(Continued)

(52) U.S. Cl.
CPC ........ *H01L 25/167* (2013.01); *H01L 23/3128* (2013.01); *H01L 23/528* (2013.01);
(Continued)

(58) Field of Classification Search
CPC ............. H01L 25/167; H01L 27/14643; H01L 27/14627; H01L 31/0203; H01L 33/54;
(Continued)

(56) References Cited

U.S. PATENT DOCUMENTS 6,266,197 B1  7/2001  Glenn et al.
6,914,245 B2  7/2005  Sone et al.
(Continued)

FOREIGN PATENT DOCUMENTS

JP   H05-013786 A   1/1993
JP   H09-018649 A   1/1997
(Continued)

*Primary Examiner* — Michael Jung
(74) *Attorney, Agent, or Firm* — Morgan, Lewis & Bockius LLP

(57) ABSTRACT

The optical device includes a photoelectric conversion block including a photoelectric conversion chip configured to include photoelectric conversion elements arranged in a matrix and a first sealing member configured to cover side faces of the photoelectric conversion chip to expose the photoelectric conversion chip and a lens block including a lens and a second sealing member configured to cover side faces of the lens to expose one surface and an other surface of the lens. In the lens block, the one surface of the lens and the second sealing member forms a recessed portion, at least a part of a bottom surface of the recessed portion being formed by the one surface of the lens, a sidewall of the recessed portion being formed by the second sealing member, and the recessed portion being arranged such that the photoelectric conversion chip exposed from the first sealing member is covered.

17 Claims, 12 Drawing Sheets

(51) Int. Cl.
*H01L 31/0203* (2014.01)
*H01L 33/54* (2010.01)
*H01L 23/528* (2006.01)
*H01L 23/31* (2006.01)
*H01L 27/15* (2006.01)
*H01L 33/58* (2010.01)

(52) U.S. Cl.
CPC .. *H01L 27/14627* (2013.01); *H01L 27/14636* (2013.01); *H01L 27/14643* (2013.01); *H01L 27/156* (2013.01); *H01L 31/0203* (2013.01); *H01L 33/54* (2013.01); *H01L 33/58* (2013.01)

(58) Field of Classification Search
CPC ... H01L 23/528; H01L 23/3128; H01L 33/58; H01L 27/14636; H01L 27/156
See application file for complete search history.

(56) References Cited

U.S. PATENT DOCUMENTS

| | | | |
|---|---|---|---|
| 7,848,639 B2 | 12/2010 | Kinoshita | |
| 8,366,317 B2 | 2/2013 | Ernst et al. | |
| 9,250,126 B2 | 2/2016 | Barlow | |
| 9,506,802 B2 | 11/2016 | Chu et al. | |
| 9,638,576 B2 | 5/2017 | Fukunaka et al. | |
| 2002/0191103 A1* | 12/2002 | Akimoto | H01L 27/14618 348/374 |
| 2003/0025825 A1 | 2/2003 | Nakajoh | |
| 2004/0065952 A1 | 4/2004 | Prior | |
| 2005/0161587 A1 | 7/2005 | Mihara et al. | |
| 2007/0272827 A1* | 11/2007 | Heo, II | H01L 27/14625 250/208.1 |
| 2008/0267616 A1* | 10/2008 | Kinoshita | H04N 5/2254 396/518 |
| 2009/0050994 A1* | 2/2009 | Ishihara | H01L 25/03 257/432 |
| 2010/0073534 A1 | 3/2010 | Yano et al. | |
| 2010/0127341 A1* | 5/2010 | Kawazu | H04N 5/2254 257/432 |
| 2011/0147872 A1 | 6/2011 | Inoue et al. | |
| 2016/0153837 A1 | 6/2016 | Kakimoto et al. | |
| 2017/0213940 A1* | 7/2017 | Sakai | H01L 33/483 |
| 2020/0144318 A1* | 5/2020 | Hsieh | H01L 27/14618 |

FOREIGN PATENT DOCUMENTS

| | | |
|---|---|---|
| JP | 2001-292365 A | 10/2001 |
| JP | 2003-185496 A | 7/2003 |
| JP | 2003-219284 A | 7/2003 |
| JP | 2005-216938 A | 8/2005 |
| JP | 2005-216940 A | 8/2005 |
| JP | 2007-013209 A | 1/2007 |
| JP | 2008-501963 A | 1/2008 |
| JP | 2008-278260 A | 11/2008 |
| JP | 2009-021307 A | 1/2009 |
| JP | 2010-103493 A | 5/2010 |
| JP | 2010-245292 A | 10/2010 |
| JP | 2013-122447 A | 6/2013 |
| JP | 2013-190243 A | 9/2013 |
| JP | 2015-049073 A | 3/2015 |
| JP | 2016-502071 A | 1/2016 |
| JP | 2016-148658 A | 8/2016 |
| WO | 2014/125800 A1 | 8/2014 |
| WO | 2014/199583 A1 | 12/2014 |

\* cited by examiner

OPTICAL DEVICE HAVING LENS BLOCK HAVING RECESSED PORTION COVERING PHOTOELECTRIC CONVERSION BLOCK

TECHNICAL FIELD

The present invention relates to optical devices, such as, for example, infrared devices.

BACKGROUND ART

Conventionally, sensors have been proposed that detect light by collecting light onto photoelectric conversion elements through a lens. For example, in an infrared sensor that detects temperature of an object by receiving infrared radiation emitted by the object, the infrared radiation is collected onto infrared detecting elements through a lens, thereby enabling detection of the temperature of the object distant from the sensor (for example, see JP 2015-049073 A).

SUMMARY

In the device as described above, the lens and a lens holder supporting the lens are formed by cutting silicon. However, in a lens holder formed of silicon, infrared radiation transmitted through a portion other than the lens (i.e., the lens holder) enters infrared sensor element, which may cause a measurement error. Due to this, the inner wall of the lens holder is protected by metal or the like that does not transmit infrared light, which makes a lens forming process complicated.

The present invention has been made in view of the above-mentioned problems. It is an object of the present invention to provide a lens-equipped optical device formable by an easy process, compact, and highly accurate in measurement.

To solve the above problems, an optical device according to one aspect of the present invention includes: a sensor block including a photoelectric conversion chip configured to include one photoelectric conversion element or a plurality of photoelectric conversion elements arranged in a matrix and a first sealing member configured to cover side faces of the photoelectric conversion chip to expose the photoelectric conversion chip; and a lens block including a lens and a second sealing member configured to cover side faces of the lens to expose one surface and an other surface of the lens, in which the lens block includes a recessed portion formed by the one surface of the lens and the second sealing member, at least a part of a bottom surface of the recessed portion being formed by the one surface of the lens, a sidewall of the recessed portion being formed by the second sealing member, and the recessed portion being arranged in such a manner as to cover the photoelectric conversion chip exposed from the first sealing member.

According to the one aspect of the present invention, there can be obtained an optical device configured to suppress variation in characteristics thereof while having a thin profile.

DESCRIPTION OF EMBODIMENTS

Hereinafter, the present invention will be described through some embodiments. It should be, however, noted that the following embodiments do not limit the present invention according to the claims. Additionally, all of combinations of features described in the embodiments are not necessarily essential for solving means of the present invention.

Each embodiment of the present invention will be described hereinbelow with reference to the drawings.

1. First Embodiment

Hereinafter, an optical device according to a first embodiment will be described with reference to FIGS. 1 to 9. The optical device according to the first embodiment is used, for example, as a motion sensor that detects the presence of a human being by detecting light, such as infrared radiation.

(Structure of Optical Device)

Figure 1A:
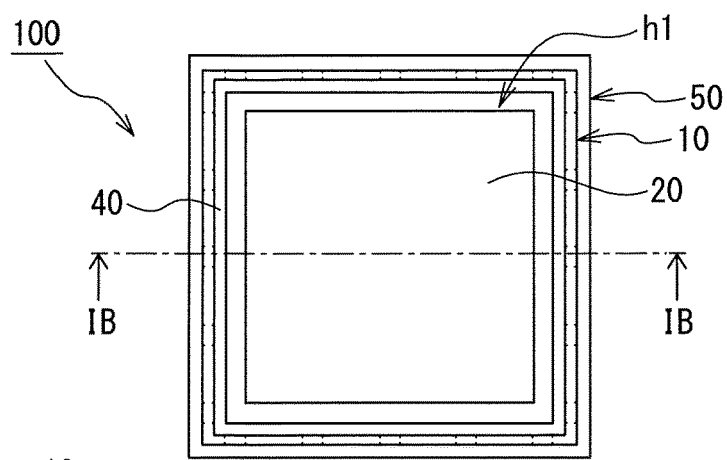
FIGS. 1A to 1D illustrate schematic views of an exemplary structure of an optical device according to a first embodiment of the present invention.
Figure 1B:
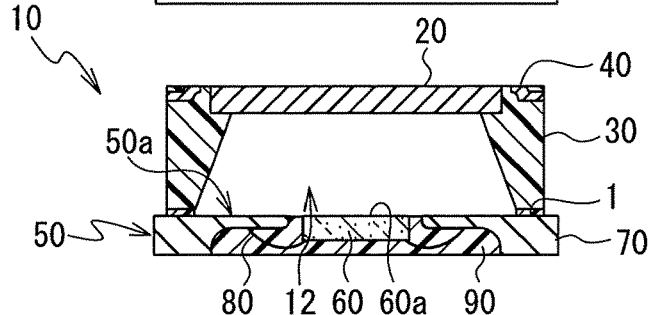
Figure 1C:
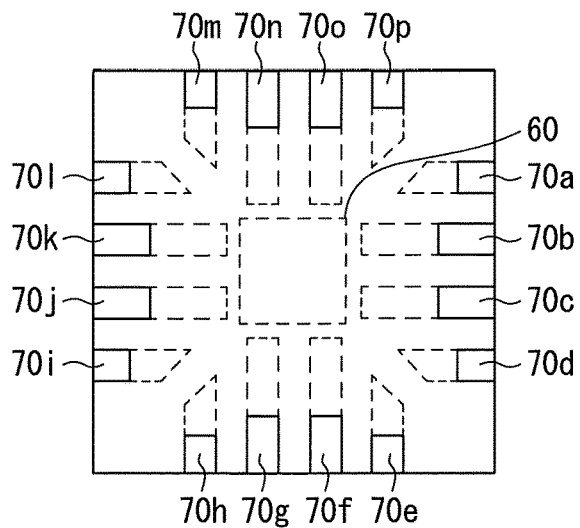
Figure 1D:
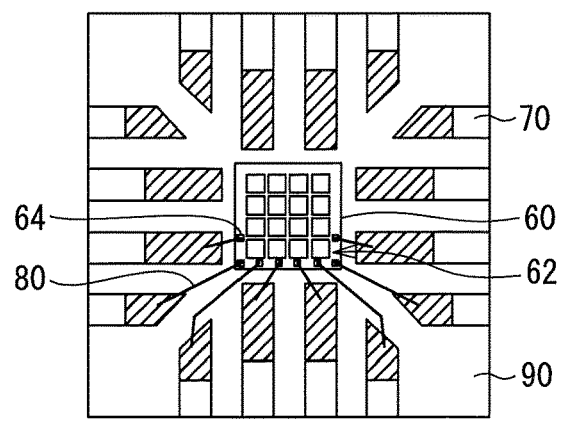

FIGS. 1A to 1D are descriptive views of the structure of an optical device 100 including a lens block 10 and a sensor block 50 (one example of a photoelectric conversion block) according to a first embodiment. FIG. 1A is a plan view illustrating an exemplary structure of the optical device 100, and FIG. 1B is a cross-sectional view illustrating the exemplary structure of the optical device 100 and taken along line IB-IB of FIG. 1A. Additionally, FIG. 1C is a bottom surface view illustrating the exemplary structure of the optical device 100, and FIG. 1D is a schematic view illustrating the arrangement and structure of each component of the sensor block 50 as seen from the bottom surface illustrated in FIG. 1C.

Figure 2A:
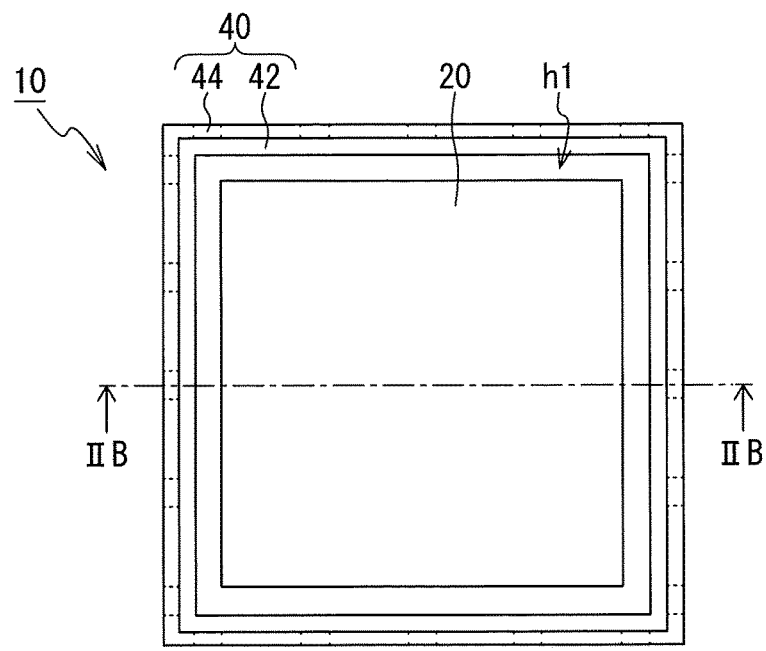
FIGS. 2A to 2C illustrate schematic views of an exemplary structure of a lens block for use in the optical device according to the first embodiment of the present invention.
Figure 2B:
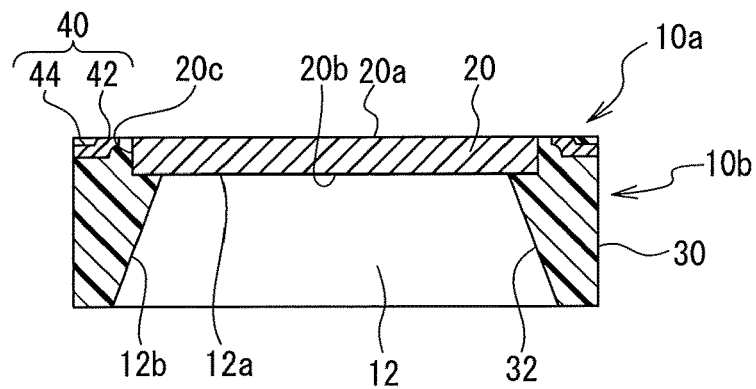
Figure 2C:
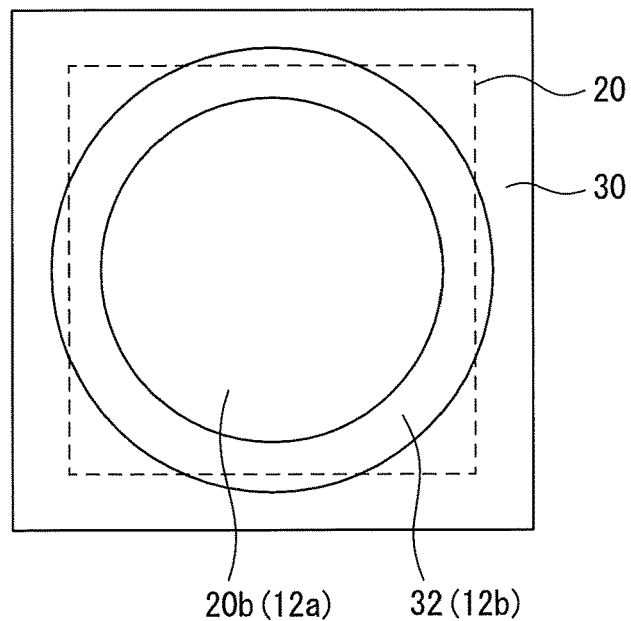

FIGS. 2A to 2C illustrate descriptive views of the lens block 10 of the optical device 100 illustrated in FIG. 1B and the like, in which FIG. 2A is a plan view illustrating an exemplary structure of the lens block 10, and FIG. 2B is a cross-sectional view illustrating the exemplary structure of the lens block 10 and taken along line IIB-IIB of FIG. 2A. The present embodiment describes a surface of the optical device 100 connected to an unillustrated circuit board (a surface thereof provided with external connection terminals) as a bottom surface, and a surface thereof (a surface thereof facing the lens block 10) into which light enters and which is opposite to the surface thereof provided with the external connection terminals as an upper surface.

As illustrated in FIGS. 1A to 1D, the optical device 100 includes the lens block 10 including a lens 20, the sensor block 50 including a photoelectric conversion chip 60, and a connection member 1 configured to connect the lens block 10 and the sensor block 50. In the optical device 100, the lens block 10 is arranged on one surface 50a side of the sensor block 50 (an upper surface of the sensor block 50 in FIG. 1B) serving as a light entering surface. In the optical device 100, light enters the photoelectric conversion chip 60 of the sensor block 50 via the lens 20 in the lens block 10, and is detected in the sensor block 50.

Hereinafter, a description will be given of each of the lens block 10, the sensor block 50, and the connection member 1.

(Lens Block)

As illustrated in FIGS. 2A to 2C, the lens block 10 includes the lens 20 and a sealing portion 30 configured to cover side faces 20c of the lens 20. The sealing portion 30 serves as a sidewall portion arranged on a lateral side of a recessed portion 12 of the lens block 10. Additionally, the lens block 10 includes a frame material 40 including a through opening h1, as illustrated in FIG. 1A. The lens 20 is arranged in the opening h1 of the frame material 40, and in this state, the side faces 20c of the lens 20 are covered with the sealing portion 30. In the lens block 10, the lens 20 and the sealing portion 30 form the recessed portion 12.

(Lens)

Figure 3A:
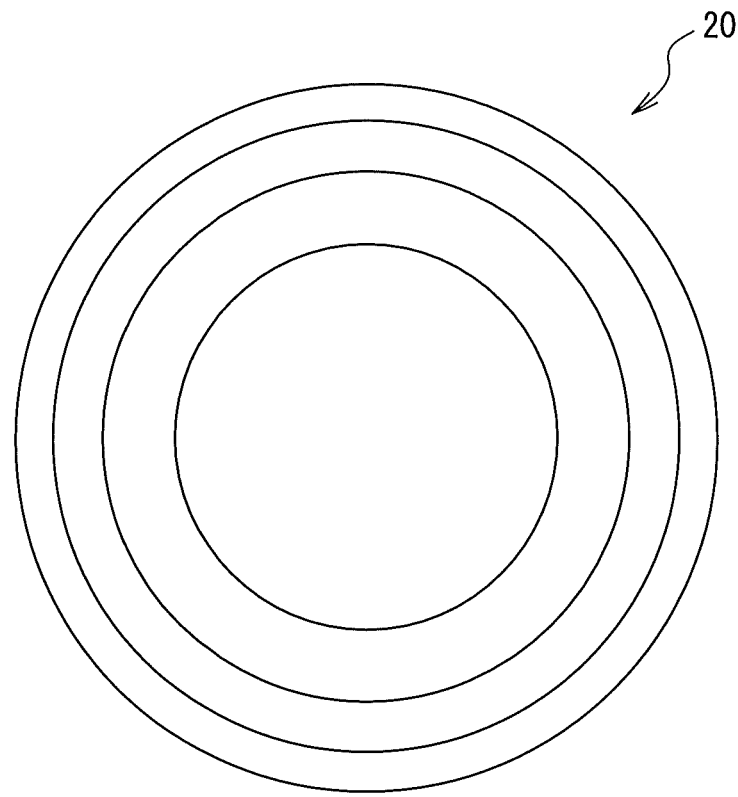
FIGS. 3A to 3C illustrate schematic views of an exemplary structure of a lens for use in the optical device according to the first embodiment of the present invention.
Figure 3B:
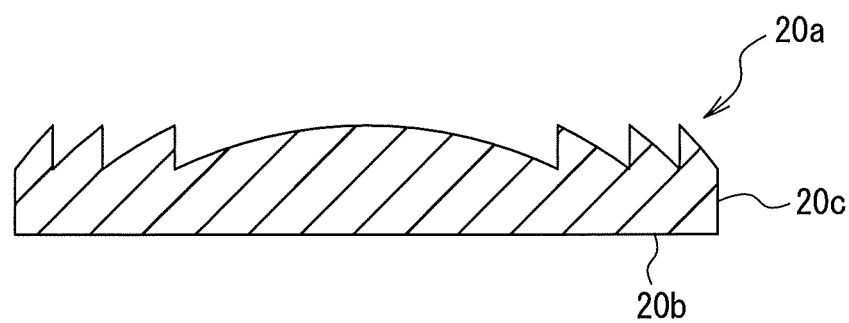
Figure 3C:
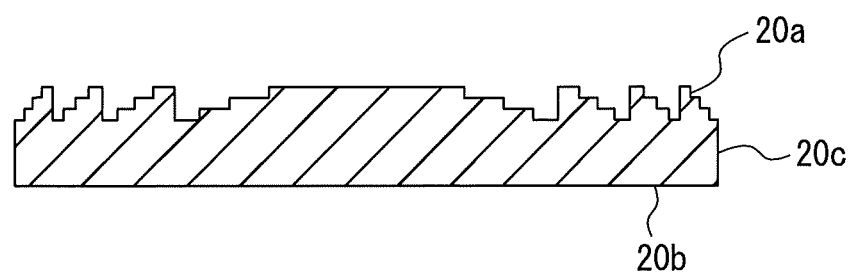

The lens 20 will be described with reference to FIGS. 3A to 3C. FIG. 3A is a plan view of a Fresnel lens (a view illustrating a lens surface), which is one example of the lens 20, and FIG. 3B is a cross-sectional view illustrating a cross section of the Fresnel lens illustrated in FIG. 3A. Additionally, FIG. 3C is a cross-sectional view illustrating a cross section of a binary lens, which is one example of the lens 20. The lens 20 is a lens formed of, for example, silicon or germanium, and is a spherical lens, an aspherical lens, a Fresnel lens, a binary lens, or the like. Among them, a binary lens is preferable as the lens 20 so that the optical device 100 can be made thin. A surface opposite to a surface formed with lens is preferably a flat surface.

The lens surface of the lens 20 is formed on one surface 20a side of the lens 20 (an upper surface of the lens 20 in FIG. 2B) serving as a light entering surface. The lens 20 may be an ordinary Fresnel lens (FIG. 3B) whose lens surface has a serrated cross-sectional shape of a blazed diffraction grating or a binary lens (FIG. 3C) whose lens surface has a cross-sectional shape formed by quantizing the serrated cross-sectional shape of the blazed diffraction grating. In the binary lens, "the shape formed by quantizing the serrated cross-sectional shape of the blazed diffraction grating" refers to a stepped shape in which the serrated cross-sectional shape of the blazed diffraction grating is approximated to a shape with a plurality of levels in the lens cross section, where, for example, the slope of one serrated portion is formed into a stepped shape with a plurality of steps (for example, four steps).

Additionally, an other surface 20b of the lens 20 (a lower surface of the lens 20 in FIG. 2B) serving as a light emitting surface is formed to be a flat surface. The lower surface 20b of the lens 20 is smoothed while adjusting the thickness of the lens 20 by, for example, back grinding (BG) or polishing.

Note that the lens 20 may be structured such that the upper surface of the lens 20 is a flat surface, and the lower surface of the lens 20 is formed with the lens surface.

(Sealing Portion)

As illustrated in FIG. 2B, the sealing portion 30 (one example of a second sealing member) is formed to extend from lateral sides of the lens 20 in a direction of the sensor block 50. The sealing portion 30 is formed of a resin material, and covers the side faces 20c of the lens 20 to expose the upper surface 20a of the lens 20 serving as the light entering surface and the lower surface 20b of the lens 20 serving as the light emitting surface from the sealing portion 30. In the example illustrated in the FIG. 2B, the sealing portion 30 covers an outer edge portion of the lower surface 20b as well as the side faces 20c of the lens 20, whereby the light emitting surface is formed at a center portion of the lower surface 20b of the lens 20. The entire surface of the upper surface 20a of the lens 20 is exposed from the sealing portion 30, so that the entire surface of the upper surface 20a of the lens 20 forms the light entering surface.

The sealing portion 30 serves as the sidewall portion arranged on the lateral side of the recessed portion 12 of the lens block 10, as described above. The resin material forming the sealing portion 30 may be a material that does not transmit infrared radiation, which is one example of light. This allows the sealing portion 30 to limit a viewing angle of light entering the lens 20 of the lens block 10. It is also possible to prevent infrared radiation from entering from a portion other than the lens 20 of the lens block 10 into the recessed portion 12. Furthermore, the sealing portion 30 is molded using a die, thereby enabling accurate formation of a focal distance from the photoelectric conversion chip 60 to the lens 20. In addition, a part of the sealing portion 30 serving as the sidewall portion of the recessed portion 12 can be formed at a predetermined height, whereby the lens 20 is not arranged obliquely with respect to the photoelectric conversion chip 60. This can improve accuracy in measurement of infrared radiation in the photoelectric conversion chip 60 of the sensor block 50. Furthermore, the lower surface of the sealing portion 30 is a surface connected to the sensor block 50. When the surface thereof connected to the sensor block 50 is formed of resin material, it is easy to arrange the sealing portion 30 on the upper surface 50a of the sensor block 50 via the connection member 1.

(Recessed Portion)

In the lens block 10, the recessed portion 12 is formed by the lower surface 20b serving as the light emitting surface of the lens 20 and an inner wall 32 of the sealing portion 30. The recessed portion 12 is formed at a depth corresponding to the focal distance of the optical device 100. Note that when the optical device 100 is an infrared sensor equipped with the lens block 10 used as a motion sensor, the depth of the recessed portion 12 is, for example, 1 mm or more. At least apart of a bottom surface 12a of the recessed portion 12 is formed by the lower surface 20b serving as the light emitting surface of the lens 20, and a sidewall 12b of the recessed portion 12 is formed by the inner wall 32, which is an inner side face of the sealing portion 30. The present embodiment illustrates one example of the case where the entire surface of the bottom surface 12a of the recessed portion 12 is formed by the lower surface 20b of the lens 20. In the first embodiment, the bottom surface 12a of the recessed portion 12 indicates the shape of a region of the lens 20 that substantially serves as the lens 20 by transmitting light, such as infrared radiation. The lens block 10 is arranged such that the recessed portion 12 covers the photoelectric conversion chip 60 exposed from a sealing portion 90 of the sensor block 50. The lens block 10 and the sensor block 50 are connected by the connection member 1 comprising an adhesive or the like.

The sidewall 12b of the recessed portion 12 is inclined with respect to the bottom surface 12a such that the diameter of the recessed portion 12 gradually becomes larger from the bottom surface 12a of the recessed portion 12 (the lower surface 20b of the lens 20) to an opening surface thereof. In other words, the inner wall 32 of the sealing portion 30 is formed to be inclined with respect to the bottom surface 12a such that an area of the opening surface of the recessed portion 12 becomes larger than an area of the bottom surface 12a of the recessed portion 12. As a result, it can be prevented that infrared radiation entering from the lower surface 20b of the lens 20 into the recessed portion 12 is reflected and enters the photoelectric conversion chip 60 of the sensor block 50, as compared to a case where the sidewall 12b of the recessed portion 12 is vertical to the bottom surface 12a.

(Frame Material)

The frame material 40 is a frame member including the opening h1 for arranging the lens 20. The frame material 40 includes an annular portion 42 surrounding the lens 20 and a connection portion 44 extending from the annular portion 42 to side faces of the lens block 10. A part of an upper surface side of the connection portion 44 is half-etched to be thinner in thickness than the annular portion 42. The annular portion 42 can be of any shape that surrounds the lens 20, and may be of a shape in which a part of the annular frame has been removed.

In the frame material 40, a part thereof is exposed from the sealing portion 30 on an upper surface 10a and side faces 10b of the lens block 10. In other words, the sealing portion 30 seals sidewall surfaces (inner and outer wall surfaces) and a bottom surface of the annular portion 42 of the frame material 40 and the connection portion 44 thereof. The frame material 40 is preferably a member with low emissivity, and, for example, preferably, a member with an emissivity of 0.3 or lower. The member with low emissivity is, for example, a metal, and specific examples of the metal include copper, silver, gold, platinum, nickel, and palladium.

When the frame material 40 is a member with low emissivity, the sensor block 50 can quantize with high accuracy the amount of infrared radiation within the viewing angle. This is because a main surface (an upper surface) of the annular portion 42 of the frame material 40 is arranged facing the upper surface 10a side serving as the light entering surface of the lens block 10. By doing this, infrared radiation output to an outer surface of the lens block 10 from a measurement target is reflected by the frame material 40 with low emissivity, without being absorbed by the lens block 10, thus suppressing temperature changes (temperature increases) in the lens block 10. A quantum infrared sensor element, which is one example of a photoelectric conversion element forming the photoelectric conversion chip 60, outputs a signal corresponding to a difference between an infrared energy input from outside and an infrared energy output by the quantum infrared sensor element itself. Emission sources of the infrared energy input from outside are an external viewing field that is the outside of the lens block 10 and the sidewall 12b (an internal viewing field) of the recessed portion 12 of the lens block 10. As described above, arranging the frame material 40 enables suppression of temperature changes in the lens block 10, thus reducing changes in the amount of infrared radiation input to the quantum infrared sensor element from the internal viewing field.

(Sensor Block)

As illustrated in FIG. 1B, the sensor block 50 includes the photoelectric conversion chip 60, a plurality of external connection terminals 70 arranged around the photoelectric conversion chip 60, a plurality of conductors 80 configured to electrically couple the photoelectric conversion chip 60 and the external connection terminals 70, and the sealing portion 90 configured to cover the side faces and lower surface (a surface formed with the semiconductor layers of photoelectric conversion elements 62) of the photoelectric conversion chip 60 to expose a light receiving surface 60a of the photoelectric conversion chip 60. FIGS. 1C and 1D illustrate 16 external connection terminals 70a to 70p as the plurality of external connection terminals 70. Hereinafter, the sensor block 50 will be described with reference to FIGS. 1B to 1D. Note that FIG. 1D is a schematic view illustrating the structure of each component of the sensor block 50 when the sensor block 50 illustrated in FIG. 1C is seen from the bottom surface (a lower side of FIG. 1D), in which a bottom surface view of the sensor block 50 not including the sealing portion 90 is illustrated to facilitate description.

(Photoelectric Conversion Chip)

The photoelectric conversion chip 60 is, for example, an array sensor in which one or more photoelectric conversion elements 62 are arranged. Arranging the lens block 10 on the array sensor allows detection of an object emitting longer range infrared radiation, and furthermore allows close detection of vertical and horizontal motions of an infrared emitting object entering within the viewing angle of the array sensor. In the photoelectric conversion chip 60 of the present embodiment, 16 photoelectric conversion elements 62 are arranged in an array of four columns by four rows, as illustrated in FIG. 1D. Additionally, the photoelectric conversion chip 60 includes a plurality of terminals 64 serving as output terminals of the 16 photoelectric conversion elements 62. FIG. 1D is a bottom surface view of the sensor block 50 illustrated omitting the sealing portion 90.

The photoelectric conversion elements 62 includes a semiconductor substrate that transmits light with specific wavelength, such as infrared radiation, and a light receiving portion formed on a back surface side of the semiconductor substrate. As the semiconductor substrate, for example, a GaAs substrate is used. Additionally, besides a GaAs substrate, for example, a semiconductor substrate made of Si, InAs, InP, GaP, Ge or the like or a substrate made of GaN or AlN, a sapphire substrate, or a glass substrate may be used. The photoelectric conversion elements 62 are arranged such that the semiconductor substrate having light transmitting properties is exposed from the sensor block 50 on the lens block 10 side of the sensor block 50. By doing this, light having specific wavelength, such as infrared radiation, entering the photoelectric conversion chip 60 is transmitted from an upper surface (the light receiving surface 60a) of the semiconductor substrate of the photoelectric conversion elements 62 to the back surface thereof (unillustrated), and then received by the light receiving portion formed on the back surface of the semiconductor substrate. The photoelectric conversion elements 62 output a signal corresponding to the entering light (infrared radiation). The signal may be extracted from current output or voltage output.

As the photoelectric conversion elements 62, there are those configured to output a signal corresponding to an absolute amount of temperature within the viewing angle and those configured to output a signal corresponding to an amount of change in temperature within the viewing angle. Examples of the former include quantum infrared sensor elements, whereas examples of the latter include pyroelectric infrared sensor elements. Infrared receiving elements outputting a signal corresponding to the absolute amount of temperature within the viewing angle output more information than infrared receiving elements outputting a signal corresponding to the amount of change in temperature within the viewing angle. Thus, it is suitable to use infrared receiving elements outputting a signal corresponding to the absolute amount of temperature within the viewing angle. As a specific structure of quantum infrared sensor elements, there may be mentioned those including a semiconductor layered portion having a PN or PIN junction. Specific examples of the semiconductor layered portion having a PN or PIN junction include those using a compound semiconductor layer containing indium and antimony. From the viewpoint that no cooling mechanism is provided, and operation at room temperature is possible, a large bandgap barrier layer is preferably provided in a part of the semiconductor layered portion. One example of the large bandgap barrier layer is an AlInSb barrier layer.

As described above, each of the plurality of photoelectric conversion elements 62 includes the semiconductor layered portion in which a semiconductor layer of a first conductivity type and a semiconductor layer of a second conductivity type (P type or N type) are layered. Thus, to extract a signal corresponding to entering light, each photoelectric conversion element 62 includes a terminal of the first conductivity type and a terminal of the second conductivity type. In other words, one photoelectric conversion element 62 requires two terminals. For example, the photoelectric conversion chip 60 includes 16 photoelectric conversion elements 62, and therefore requires 16 terminals of the first conductivity type and 16 terminals of the second conductivity type, i.e., 32 terminals 64 in total. On the other hand, the photoelectric conversion chip 60 may be structured to include a smaller number of terminals 64 than an originally required number of terminals 64 by communizing some (for example, the terminals of the second conductivity type) of the terminals for extracting a signal from each of the 16 photoelectric conversion elements 62. For example, the 16 terminals of the second conductivity type connected to the above-described 16 photoelectric conversion elements 62 can be commonized into one terminal. In this case, 17 terminals 64 in total can be provided that consist of the 16 terminals 64 of the first conductivity type and one terminal 64 of the second conductivity type. As illustrated in FIG. 1D, the photoelectric conversion chip 60 of the present embodiment represents an example including 8 terminals 64 by communizing the terminals 64 connected to the 16 photoelectric conversion elements 62 in order to further reduce the number of the terminals 64, although there is a disadvantage that signal intensity is decreased. In the photoelectric conversion chip 60, the individual terminals 64 of the first conductivity type of four photoelectric conversion elements 62 arranged in one direction are commonized into one terminal 64, and the individual terminals 64 of the second conductivity type thereof are commonized into one terminal. In the same way, one terminal 64 of the first conductivity type and one terminal 64 of the second conductivity type are provided for each group consisting of four photoelectric conversion elements 62. Thus, since the photoelectric conversion chip 60 includes four columns of groups each consisting of the four photoelectric conversion elements 62, there are provided four terminals 64 of the first conductivity type and four terminals 64 of the second conductivity type i.e., eight terminals 64 in total. In other words, each of the terminals 64 serves as terminals of the plurality of photoelectric conversion elements 62.

The terminals 64 are each electrically coupled to the external connection terminals 70 by the conductors 80 formed by using a metallic wire or the like.

(External Connection Terminals)

The external connection terminals 70 are arranged to be partially exposed from the sealing portion 90 so as to be electrically coupled to an unillustrated circuit board or the like. In the present embodiment, as illustrated in FIG. 1C, four each of 16 external connection terminals 70a to 70p as the external connection terminals 70 are placed side by side on each side of the sensor block 50 having a rectangular shape, and arranged in such a manner as to surround the photoelectric conversion chip 60. The external connection terminals 70 are made of, for example, copper (Cu), and preferably, external surfaces thereof are multilayer plated by plating nickel (Ni), palladium (Pd), and gold (Au) in order thereon or plated with tin (Sn).

As illustrated in FIG. 1C, the external connection terminals 70 are exposed from the sealing portion 90 in the vicinities of an outer periphery of the bottom surface of the sensor block 50. Additionally, as illustrated in FIG. 1D, apart of each of the external connection terminals 70 (a part of each thereof near the photoelectric conversion chip 60) on the bottom surface side of the sensor block 50 is half-etched to be thin in thickness. In FIG. 1D, the half-etched parts of the external connection terminals 70 are indicated by oblique lines. The conductors 80 are connected to the half-etched parts of the external connection terminals 70. The sensor block 50 of the present embodiment represents an example where eight conductors 80 connected to eight terminals 64 are connected to eight external connection terminals 70 (70c to 70j). In other words, terminals serving as substantially those for external connection in the sensor block 50 are the external connection terminals 70c to 70j.

(Sealing Portion)

The sealing portion 90 (one example of a first sealing member) covers the side faces of the photoelectric conversion chip 60 to expose the photoelectric conversion chip 60. The sealing portion 90 is formed of a resin material, and covers the side faces of the photoelectric conversion chip 60 to expose the light receiving surface 60a of the photoelectric conversion chip 60. Note that it is sufficient that the sealing portion 90 is formed such that light such as infrared radiation can enter the light receiving portion via the semiconductor substrate, and there is no particular limitation on which face of the photoelectric conversion chip 60 is covered therewith. For example, the sealing portion 90 does not have to cover a part of the side faces of the photoelectric conversion chip 60.

The sealing portion 90 is formed using, preferably, a resin material, from the viewpoints of mass productivity, mechanical strength, and the like. The sealing portion 90 is formed of a resin material such as, for example, epoxy resin for use in ordinary semiconductor devices. Additionally, the material forming the sealing portion 90 may include filler (s), inevitably mixed impurities, and the like, besides a resin material such as epoxy resin. Suitable examples of the filler(s) to be used include silica and alumina. The amount of filler(s) to be mixed is preferably from 50% by volume to 99% by volume, more preferably from 70% by volume to 99% by volume, and still more preferably from 85% by volume to 99% by volume, in the material forming the sealing portion 90.

(Connection Member)

The connection member 1 is formed of a resin material such as, for example, thermosetting resin, and connects the sensor block 50 and the lens block 10. The connection member 1 is provided, for example, outside a region of the sensor block 50 in which the photoelectric conversion chip 60 is exposed. By doing this, the connection member 1 can connect the sensor block 50 and the lens block 10 such that the recessed portion 12 of the lens block 10 covers the photoelectric conversion chip 60.

As illustrated in FIG. 1B, the connection member 1 may be provided at a part of the upper surface 50*a* of the sensor block 50 (a surface thereof facing the lens block 10), which is a part in a circumferential direction of the facing surface thereof, so that the sensor block 50 and the lens block 10 may be connected via a gap formed between the sensor block 50 and the lens block 10. Exposure of the optical device 100 to a high temperature environment inflates air in the recessed portion 12 partitioned by the sensor block 50 and the lens block 10. Forming the gap between the sensor block 50 and the lens block 10 allows the inflated air to be discharged from the recessed portion 12 via the gap, which is therefore preferable. Particularly, when using a thermosetting resin as the connection member 1, the sensor block 50 and the lens block 10 are exposed to an extremely high temperature environment at curing of the connection member 1, so that it is more preferable to form a gap between the sensor block 50 and the lens block 10.

(Method for Manufacturing Optical Device)

Hereinafter, a method for manufacturing the optical device 100 according to the present embodiment will be described using cross-sectional views of steps illustrated in FIGS. 4A to 4F and FIGS. 5A to 5F. FIGS. 4A to 4F illustrate steps of forming the lens block 10. Additionally, FIGS. 5A to 5F illustrate steps of forming the sensor block 50. In in FIGS. 4A to 4F and FIGS. 5A to 5F, each step will be described along the cross section illustrated in FIG. 1B.

(Method for Manufacturing Lens Block)

Figure 4A:
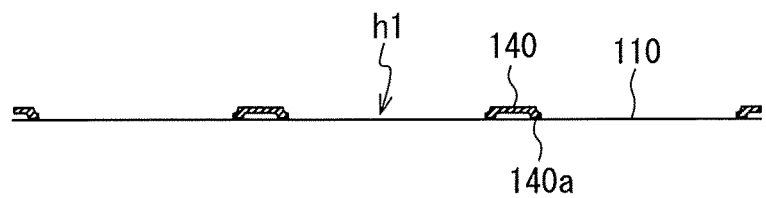
FIGS. 4A to 4F illustrate cross-sectional process views describing a process for manufacturing the optical device according to the first embodiment of the present invention.
Figure 4B:
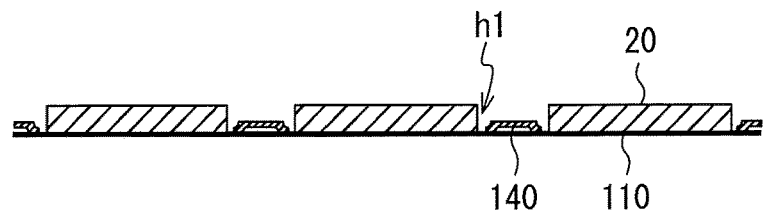

As illustrated in FIG. 4A, first of all, a heat-resistant adhesive sheet 110 is prepared, and a front surface 140*a* of a lead frame 140 is attached onto an adhesive layer of the adhesive sheet 110. The lead frame 140 is cut into a plurality of frame materials 40 later. As illustrated in FIG. 4B, the lens 20 is placed in the opening h1 of the lead frame 140, and the upper surface 20*a* of the lens 20 serving as the light entering surface is attached onto the adhesive layer of the adhesive sheet 110.

Figure 4C:
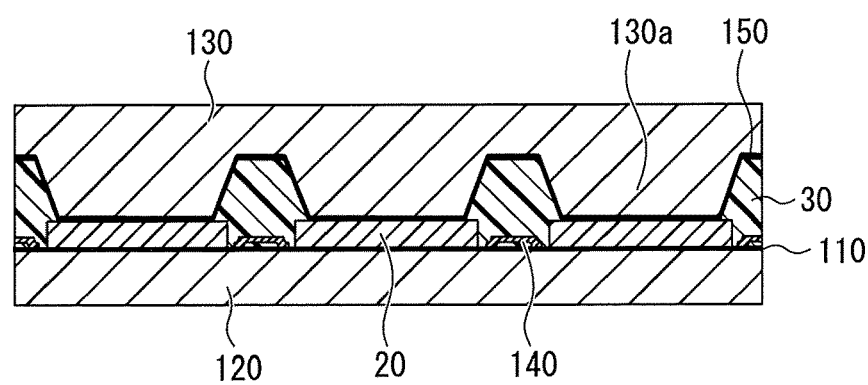

Next, as illustrated in FIG. 4C, a lower die 120 is arranged on the front surface 140*a* side of the lead frame 140, and also an upper die 130 is arranged on a back surface 140*b* side of the lead frame 140. Then, the lower die 120 and the upper die 130 sandwich the lens 20, and a molten resin material such as epoxy resin is injected and filled into a space between the lower die 120 and the upper die 130 from a lateral side, and then cured, as a result of which the sealing portion 30 is formed. As illustrated in FIG. 4C, for example, the upper die 130 has a lower surface having a recessed and protruding shape in a cross-sectional view, where protruding portions 130*a* face the lens 20 via a resin sheet 150 formed of a fluorine resin or the like. The protruding portions 130*a* form recessed portions 12 in the lens block 10, as illustrated in FIG. 4D.

Figure 4D:
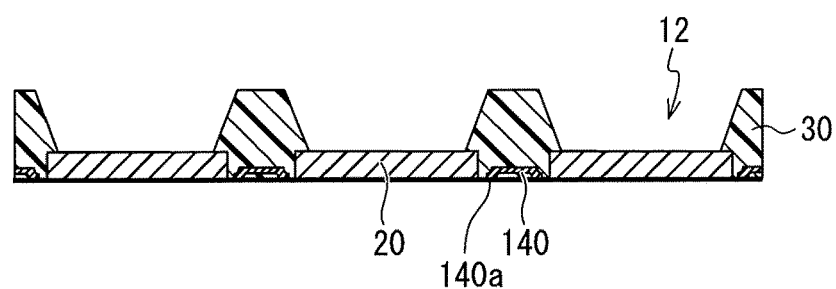

As illustrated in FIG. 4D, the sealing portion 30 sealing the lens 20 and the lead frame 140 is taken out from between the lower die 120 and the upper die 130. The adhesive sheet 110 is removed from the front surface 140*a* side of the lead frame 140. After removal of the adhesive sheet 110, post cure is performed if necessary.

Figure 4E:
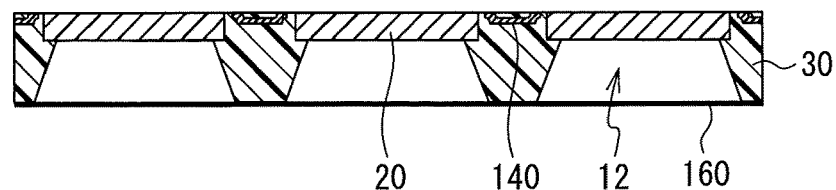
Figure 4F:
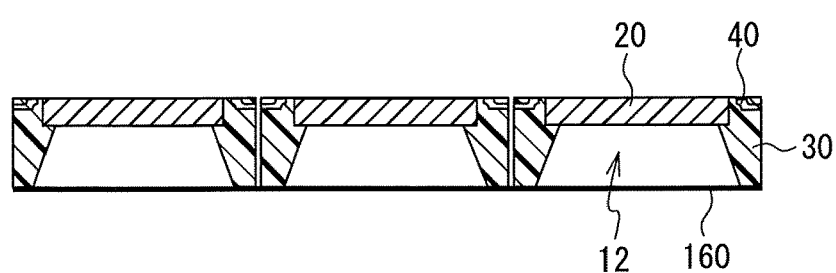

As illustrated in FIG. 4E, a dicing tape 160 is attached onto a back surface side of the sealing portion 30, and diced into individual pieces by a dicing device. As a result, the sealing portion 30 and the lead frame 140 are cut off into individual sensor blocks, as illustrated in FIG. 4F, thereby completing the lens block 10 illustrated in FIGS. 2A to 2C.

(Method for Manufacturing Sensor Block)

Figure 5A:
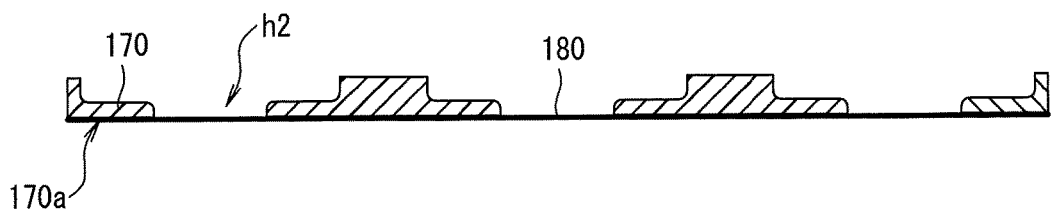
FIGS. 5A to 5F illustrate cross-sectional process views describing the process for manufacturing the optical device according to the first embodiment of the present invention.

As illustrated in FIG. 5A, first of all, a heat-resistant adhesive sheet 180 is prepared. Next, a front surface 170*a* of a copper lead frame 170 externally plated with Ni, Pd, and Au in order is attached onto an adhesive layer of the adhesive sheet 180. Note that the same tape as the adhesive sheet 110 can be used as the adhesive sheet 180.

Figure 5B:
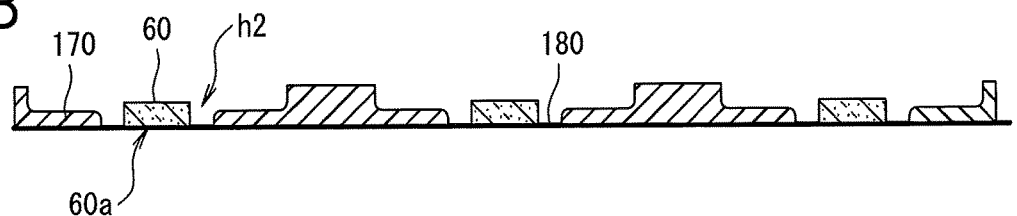
Figure 5C:
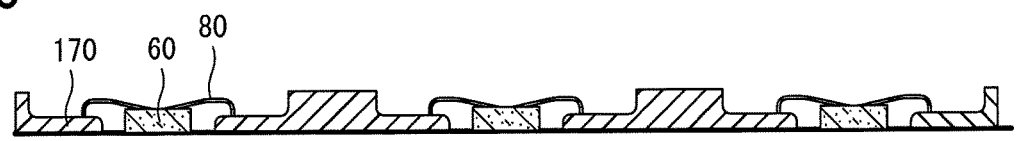

Next, as illustrated in FIG. 5B, in each through opening h2 included in the lead frame 170 is arranged the photoelectric conversion chip 60 where the plurality of photoelectric conversion elements 62 are arranged in a matrix form. In this case, the light receiving surface 60*a* of the photoelectric conversion chip 60 is attached onto the adhesive layer of the adhesive sheet 180. Next, as illustrated in FIG. 5C, the photoelectric conversion chip 60 and the lead frame 170 are connected by using each conductor 80.

Figure 5D:
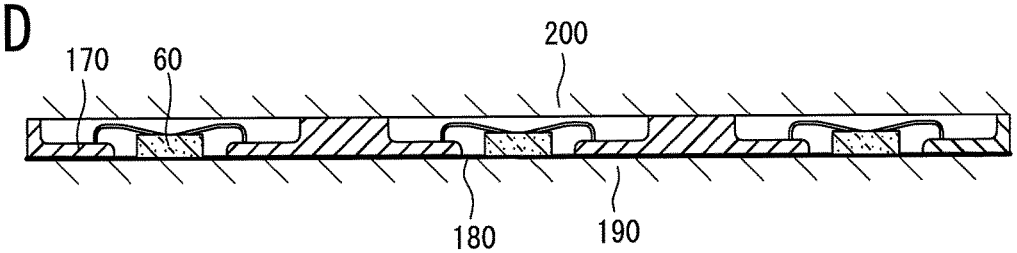

Next, as illustrated in FIG. 5D, a lower die 190 is arranged on the front surface 170*a* side of the lead frame 170, and also an upper die 200 is arranged on a back surface 170*b* side of the lead frame 170. Then, the lower die 190 and the upper side 200 sandwich the lead frame 170, and a molten epoxy resin or the like is injected and filled into a space between the lower die 190 and the upper die 200 from a lateral side. As a result, the sealing portion 90 is formed. Note that the material of the sealing portion 90 can be the same as that of the sealing portion 30 of the lens block 10.

Figure 5E:
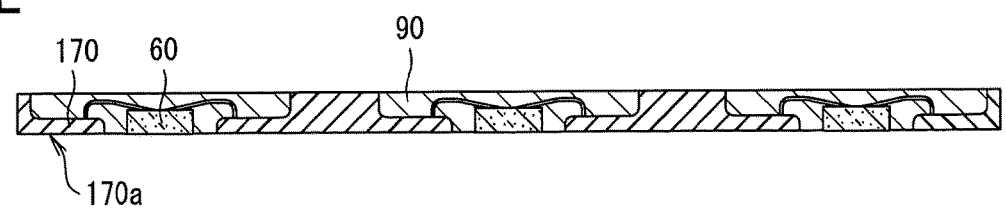
Figure 5F:
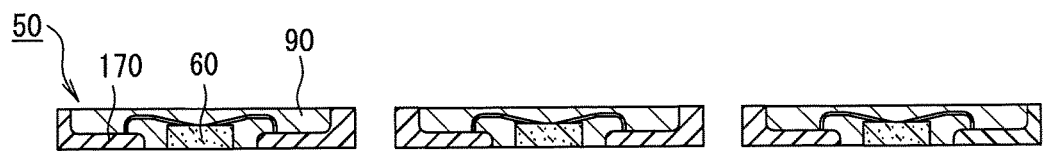

Next, the lower die 190 and the upper die 200, respectively, are moved to take out the lead frame 170 with the sealing portion 90 formed thereon from between both dies, as illustrated in FIG. 5E. Then, the adhesive sheet 180 is removed from the front surface 170*a* side of the lead frame 170. After removal of the adhesive sheet 180, post cure is performed to further cure the sealing portion 90. After that, the sealing portion 90 and the lead frame 170 are attached onto an unillustrated dicing tape, and diced into individual pieces by a dicing device. As a result, the sealing portion 90 and the lead frame 170 are cut off into individual sensor blocks, as illustrated in FIG. 5F, thereby completing the sensor block 50 illustrated in FIG. 1B and the like.

(Method for Connecting Lens Block and Sensor Block)

The lens block 10 and the sensor block 50 are connected as follows. Firstly, a thermosetting resin, which is, for example, an adhesive, is applied on the upper surface 50*a* of the sensor block 50. The region applied with the adhesive can be any region other than the photoelectric conversion chip 60, and is provided, for example, outside a region of the sensor block 50 where the photoelectric conversion chip 60 is exposed. A back surface side of the lens block 10 (a side thereof where the recessed portion 12 is formed) is contacted with the upper surface 50a of the sensor block 50 applied with the adhesive. After this, for example, heat treatment is performed to cure the adhesive.

As a result, the lens block 10 and the sensor block 50 are connected to complete the optical device 100 illustrated in FIGS. 1A to 1D.

Effects of First Embodiment (1) In the optical device 100 of the present embodiment, the lens block 10 includes a plate-shaped lens 20 having one surface processed as a lens surface and the resinous sealing portion 30 covering the side faces 20c of the lens 20. Thus, the lens 20 is easily formed. As a result, the recessed portion 12 having a depth of a constant focal distance (for example, 1 mm or more) from the photoelectric conversion chip 60 can be easily and accurately formed. In addition, when forming the recessed portion 12, cutting of silicon or the like is unnecessary, so that effective material utilization can be achieved.

(2) In the optical device 100 of the present embodiment, the sealing portion 30 molded by resin molding can form the sidewall 12b of the recessed portion 12 of the lens block 10. The sealing portion 30 is molded using the dies, whereby the focal distance from the photoelectric conversion chip 60 to the lens 20 can be accurately formed. Additionally, a part of the sealing portion 30 serving as the sidewall portion of the recessed portion 12 can be formed at a predetermined height, which prevents the lens 20 from being arranged obliquely with respect to the photoelectric conversion chip 60.

(3) The optical device 100 of the present embodiment may include the frame material 40 comprising a material with low emissivity. In this case, infrared light output to the outer surface of the lens block 10 from a measurement target is reflected by the frame material 40 with low emissivity, thereby suppressing temperature changes (temperature increases) in the lens block 10. Thus, it can be prevented that the sensor block 50 detects changes in the amount of infrared light due to temperature changes in the lens block 10, whereby the amount of infrared light within the viewing angle can be quantized with high accuracy.

Modification (1) The present embodiment has described the case where the bottom surface 12a of the recessed portion 12 of the lens block 10 has a circular shape, i.e., the shape of the recessed portion 12 is frustoconical. However, the shape of the recessed portion 12 is not limited thereto. For example, the bottom surface 12a of the recessed portion 12 of the lens block 10 may have a frustopyramidal shape, and the shape of the recessed portion 12 may be frustopyramidal. When forming the recessed portion 12 into a frustopyramidal shape, formation of the sealing portion 30 may cause the resin material to ooze out onto the lower surface 20b of the lens 20 serving as the light emitting surface or cause the resin sheet 150 illustrated in FIG. 4C to be easily broken at corners of the protruding portion 130a of the upper die 130. Due to this, to form the recessed portion 12 into a frustopyramidal shape, it is more preferable to form the sealing portion 30 into a shape such that the slope of the inner wall 32 spreads widely, i.e., an angle formed between the bottom surface 12a of the recessed portion 12 and the sidewall 12b is 120° or more, or the like.

Figure 6A:
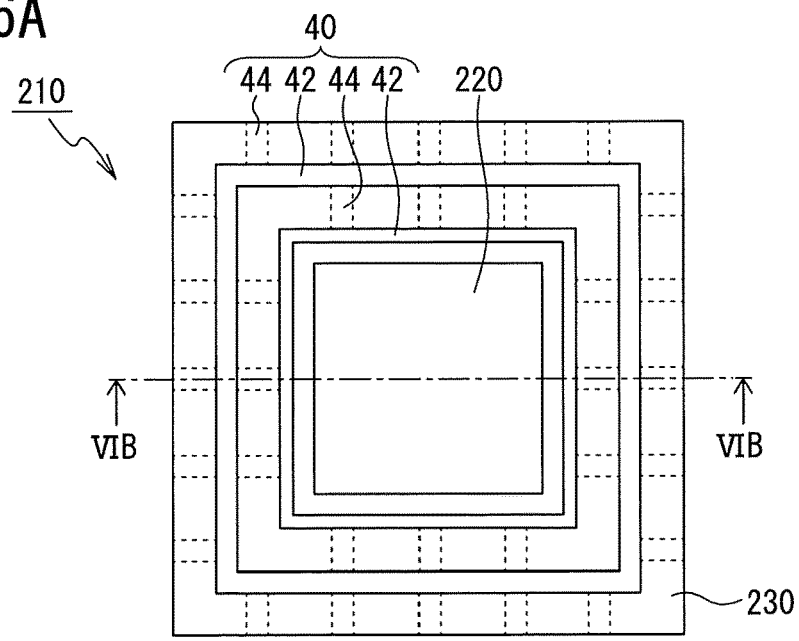
FIGS. 6A to 6C illustrate schematic views of another exemplary structure of the lens block for use in the optical device according to the first embodiment of the present invention.
Figure 6B:
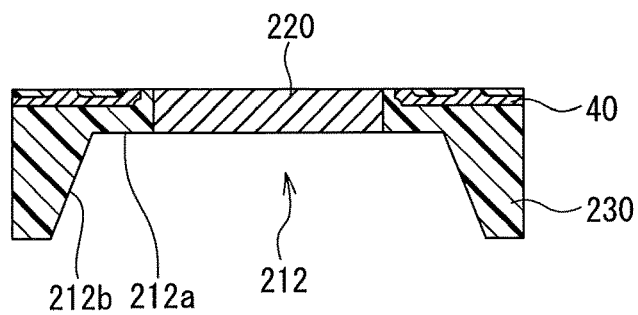
Figure 6C:
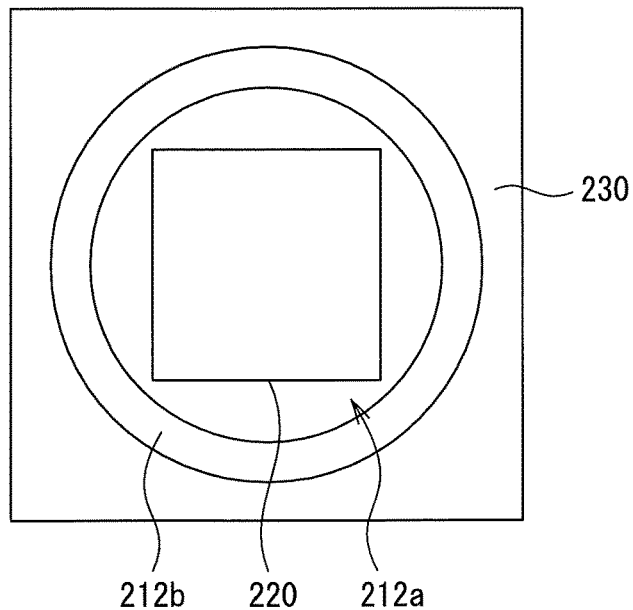

(2) The present embodiment has described the case where the bottom surface 12a of the recessed portion 12 of the lens block 10 has the circular shape, and the entire surface of the bottom surface 12a is formed by the lower surface 20b of the lens 20. However, the structure of the lens block 10 is not limited thereto. For example, as illustrated in FIGS. 6A to 6C, a rectangular lens 220 having a smaller external shape than a bottom surface 212a of a recessed portion 212 of a lens block 210 may be used, in which a part of the bottom surface 212a having a circular shape may be formed by the rectangular lens 220, and the remaining part of the circular bottom surface 212a may be formed by a sealing portion 230. Note that FIG. 6A is a plan view of the lens block 210, FIG. 6B is a cross-sectional view illustrating a cross section taken along line VIB-VIB of FIG. 6A, and FIG. 6C is a bottom surface view of the lens block 210. In this case, the rectangular lens 220 is preferably arranged at a predetermined distance from an outer periphery of the bottom surface 212a in a plan view. If the outer periphery of the bottom surface 212a of the recessed portion 212 is in contact with corners of the lens 220, molten resin is easy to ooze out onto a lower surface 220b of the lens 220 when forming the sealing portion 230. Arranging the rectangular lens 220 at a predetermined distance from the outer periphery of the bottom surface 212a can suppress the oozing of the resin mentioned above, whereby it can be prevented that the area of a light emitting surface for emitting infrared light or the like becomes small, and thereby light receiving efficiency is reduced.

Figure 7:
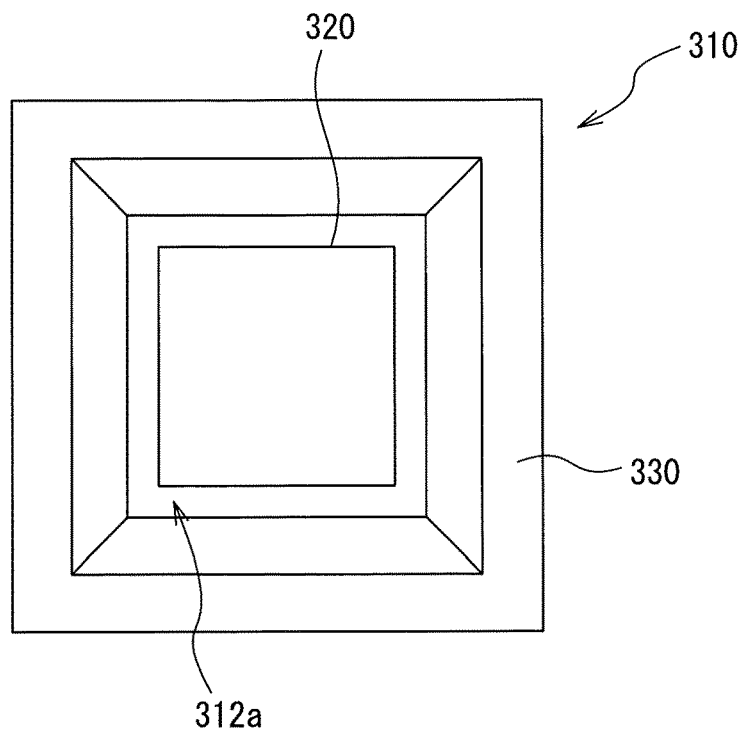
FIG. 7 illustrates a schematic view of another exemplary structure of the lens block for use in the optical device according to the first embodiment of the present invention.

(3) In the lens block 210 illustrated in FIGS. 6A to 6C, the bottom surface 212a of the recessed portion 212 is circular in shape. However, as illustrated in FIG. 7, a bottom surface 312a of a recessed portion 312 of a lens block 310 may be rectangular in shape. In this case, a part of the rectangular bottom surface 312a is formed by a rectangular lens 320, and the remaining part of the bottom surface 312a is formed by a sealing portion 330. The rectangular lens 320 is preferably arranged at a predetermined distance from an outer periphery of the bottom surface 312a in a plan view, as with the lens block 210 illustrated in FIG. 6. Note that FIG. 7 is a bottom surface view of the lens block 310.

Figure 8:
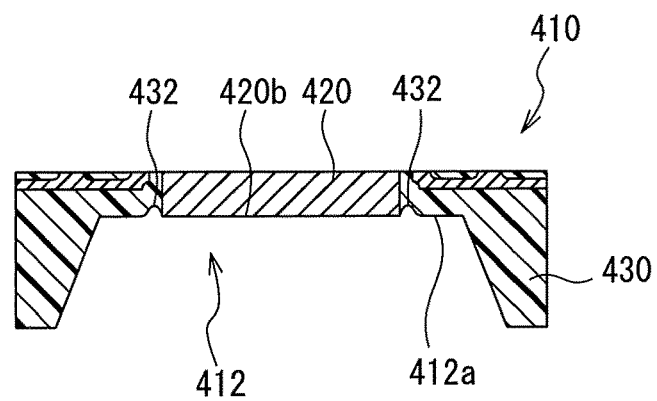
FIG. 8 illustrates a schematic view of another exemplary structure of the lens block for use in the optical device according to the first embodiment of the present invention.
Figure 9:
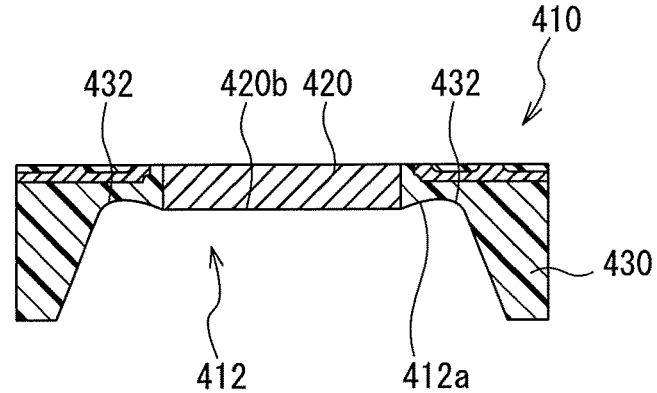
FIG. 9 illustrates a schematic view of another exemplary structure of the lens block for use in the optical device according to the first embodiment of the present invention.

(4) In the lens block 210 illustrated in FIGS. 6A to 6C, the lens 220 and the sealing portion 230 are formed in the same plane (i.e., the front surface of the lens 220 is flush with the front surface of the sealing portion 230) on the bottom surface 212a side of the recessed portion 212. However, the structure of the lens block 210 is not limited thereto. For example, as in a lens block 410 illustrated in FIG. 8, a part of a bottom surface 412a of a recessed portion 412 may be formed by a lens 420, and the remaining part of the bottom surface 412a may be formed by a sealing portion 430, in which the sealing portion 430 may include a grooved portion 432 around a lower surface 420b of the lens 420. Note that FIG. 8 is a cross-sectional view of the lens block 410. Furthermore, as in a lens block 410 illustrated in FIG. 9, a part of the bottom surface 412a of the recessed portion 412 may be formed by the lens 420, and the remaining part of the bottom surface 412a may be formed by the sealing portion 430, in which the entire sealing portion 430 of the remaining part of the bottom surface 412a may be the grooved portion 432. With such a structure, the oozing of the resin can be further suppressed, transmission of light from side faces of the lens 420 can be prevented, and the side faces of the lens 420 can be more firmly retained by the sealing portion 430. Note that FIG. 9 is a cross-sectional view illustrating the other exemplary structure of the lens block 410. In FIG. 9, the portions common to those in FIG. 8 are described by using the same reference signs.

When forming the sealing portion 430, for example, pressing the resin sheet 150 as illustrated in FIG. 4C against the lens 420 by the protruding portion 130a of the upper die 130 may cause deformation of the resin sheet in the vicinity of the lens 420 (the bottom surface 412a around the lens 420 and a region of a sidewall 412b not higher than a half of the height of the sidewall 412b from the bottom surface 412a). Specifically, when the protruding portion 130a is pressed against the lens 420 having a smaller external shape than the protruding portion 130a in a plan view, a part of the resin sheet 150 sandwiched between the protruding portion 130a and the lens 420 is greatly compressed. Additionally, on a part of the resin sheet 150 located at an outer peripheral portion of the lens 420, there is no pressing force of the lens 420 against the resin sheet 150, so that the part of the resin sheet 150 located thereat is shaped to be thicker in the direction of the lower die 120 as compared with the part thereof sandwiched between the protruding portion 130a and the lens 420. Accordingly, when resin molding is performed in that state, the grooved portion 432 along the shape of the resin sheet 150 is formed in the sealing portion 430 around the lower surface 420b of the lens 420. In the lens block 410 thus formed, there is a high degree of adhesion between the lens 420 and the upper die 130, and the thickness of the resin sheet 150 around the lens 420 increases, so that the molten resin hardly oozes out between the lens 420 and the upper die 130. As a result, the lower surface 420b of the lens 420 is not covered with the resin, which thus can suppress blocking of emission of light entering the lens 420.

(5) In the present embodiment, the entire surface of the bottom surface 12a of the recessed portion 12 of the lens block 10 is formed by the lens 20, as illustrated in FIG. 2B. In addition, the sidewall 12b of the recessed portion 12 is inclined with respect to the bottom surface 12a such that the diameter of the recessed portion 12 gradually becomes larger from the bottom surface 12a of the recessed portion 12 (the lower surface 20b of the lens 20) to the opening surface. In other words, as illustrated in FIG. 2B, the wall surface of the inner wall 32 of the sealing portion 30 has a liner shape in a cross-sectional view. However, the shape of the inner wall 32 of the sealing portion 30 is not limited to such a shape.

Figure 10A:
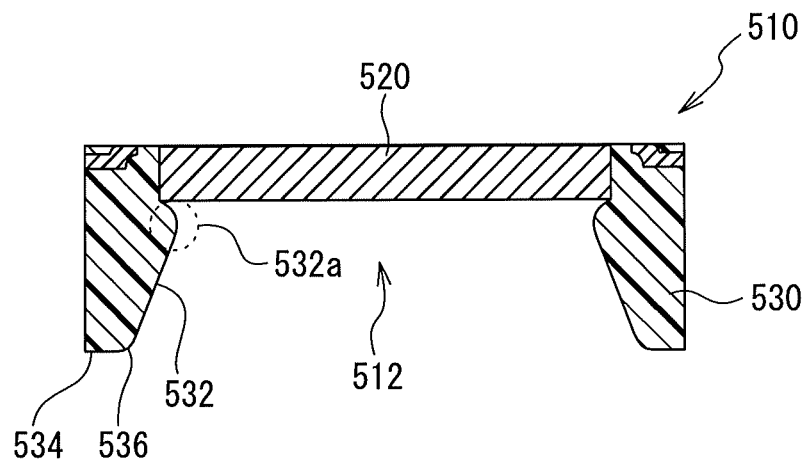
FIG. 10A or 10B illustrate schematic views of another exemplary structure of the lens block for use in the optical device according to the first embodiment of the present invention.
Figure 11A:
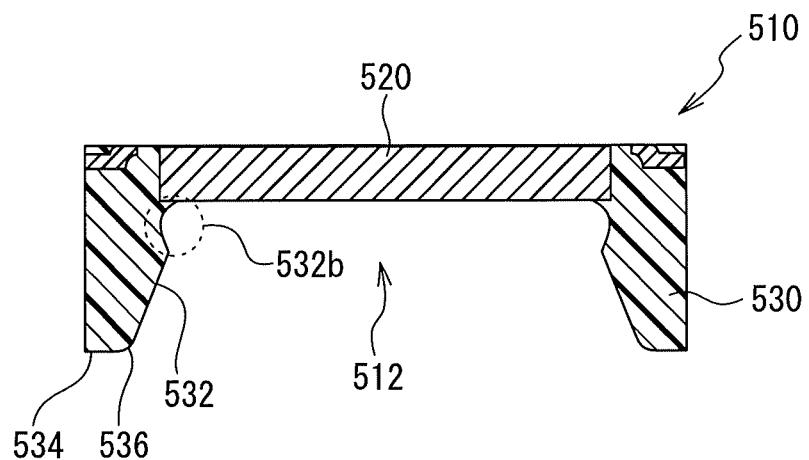
FIG. 11A or 11B illustrate schematic views of another exemplary structure of the lens block for use in the optical device according to the first embodiment of the present invention.

For example, as illustrated in FIG. 10A, an inner wall 532 of a sealing portion 530 of a lens block 510 may include a protruding portion 532a protruding curvedly in a cross-sectional view with respect to a recessed portion 512 in the vicinity of the lens 520. Additionally, as illustrated in FIG. 11A, the inner wall 532 may include a recessed portion 532b recessed curvedly in a cross-sectional view with respect to the recessed portion 512 in the vicinity of the lens 520. Herein, the expression "curvedly in a cross-sectional view" means that the inner wall 532 has a curved surface from the vicinity of the lens 520 on the inner wall 532 to an end portion on the sensor block 50 side. The protruding portion 532a or the recessed portion 532b is formed into a shape corresponding to deformation of the resin sheet 150 at the time of formation of the sealing portion 530, as will be described later. In addition, a surface 534 of the sealing portion 530 facing the sensor block 50 and the inner wall 532 thereof may be continued by a curved surface 536. Herein, FIG. 10A illustrates the lens block 510 including the protruding portion 532a in the vicinity of the lens 520 on the inner wall 532. Furthermore, FIG. 11A illustrates the lens block 510 including the recessed portion 532b in the vicinity of the lens 520 on the inner wall 532.

Figure 10B:
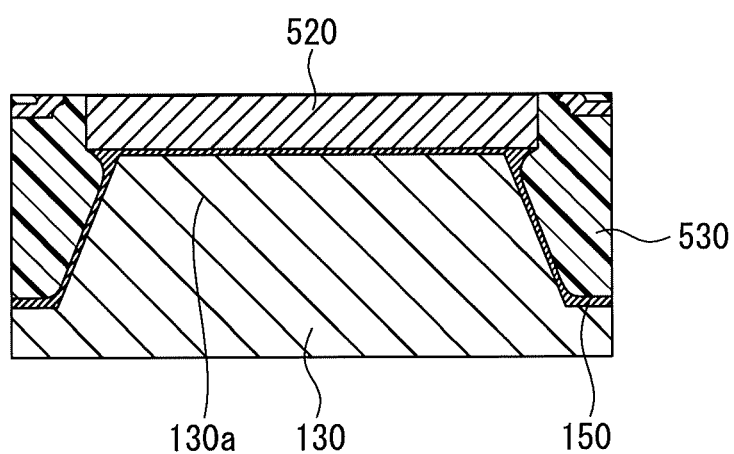

FIG. 10B illustrates a step of forming the sealing portion 530. As illustrated in FIG. 10B, the resin sheet 150 is pressed against the lens 520 by the protruding portion 130a of the upper die 130, which may deform the resin sheet 150 in the vicinity of the lens 520. Specifically, as illustrated in FIG. 10B, when the protruding portion 130a is pressing against the lens 520 having a larger external shape than the protruding portion 130a in a plan view, a part of the resin sheet 150 sandwiched between the protruding portion 130a and the lens 520 is greatly compressed. Additionally, at an outer peripheral portion of the protruding portion 130a, the resin sheet 150 is deformed to follow along the lens 520. Thus, performing resin molding in that state allows the sealing portion 530 to be formed into a shape including the protruding portion 532a protruding curvedly in a cross-sectional view with respect to the recessed portion 512 in the vicinity of the lens 520 on the inner wall 532.

Figure 11B:
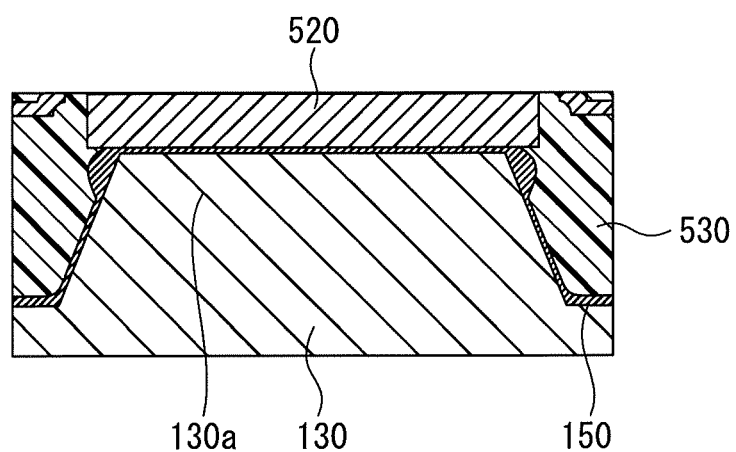

In addition, when forming the sealing portion 530, for example, as illustrated in FIG. 11B, the resin sheet 150 may follow along the upper die 130 in a shape having curvature at a base of the protruding portion 130a of the upper die 130. Thus, when the sealing portion 530 is formed using the resin sheet 150, a part of the inner wall 532 facing the base of the protruding portion 130a is formed in a curved shape along the shape of the resin sheet 150, as illustrated in FIG. 11B. In the lens block 510 thus formed, when the degree of adhesion between the lens 520 and the upper die 130 is high in a manufacturing process, molten resin hardly oozes out between the lens 520 and the upper die 130. The increased degree of adhesion between the lens 520 and the upper die 130 causes formation of the recessed portion 532b, which is a curved deformation, in the lens block 510. As a result, in the lens block 510 including the recessed portion 532b, the lower surface 520b of the lens 520 is covered with molten resin, which thus can suppress blocking of emission of light entering the lens 520.

(6) While the present embodiment has described the optical device as an infrared sensor configured to receive light such as infrared light, the optical device is not limited to such a structure. For example, the optical device may be an infrared emitting device in which a photoelectric conversion chip includes light emitting elements emitting light such as infrared radiation, and a lens block is connected in such a manner as to cover the light emitting elements of a photoelectric conversion block.

2. Second Embodiment

Figure 12A:
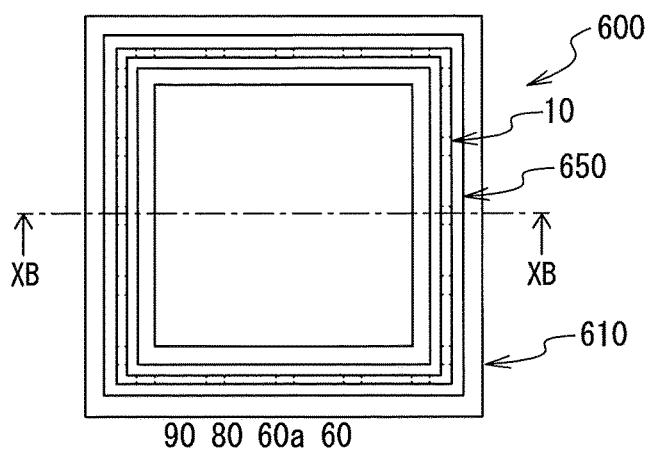
FIGS. 12A to 12D illustrate schematic views of an exemplary structure of an optical device according to a second embodiment of the present invention.
Figure 12B:
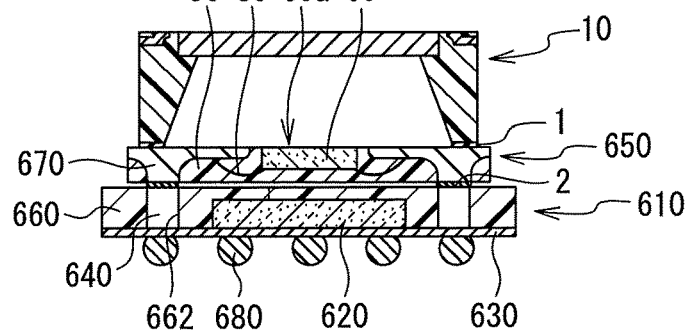
Figure 12C:
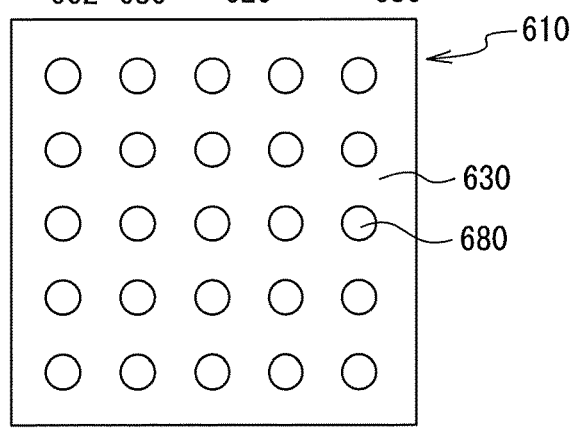
Figure 12D:
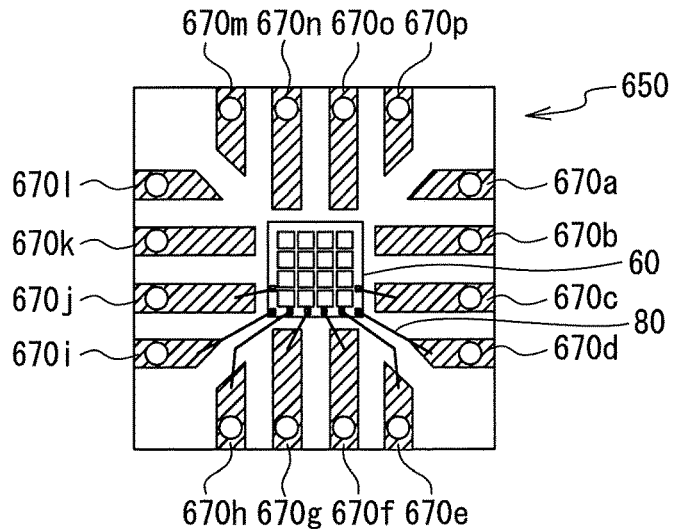

Hereinafter, a second embodiment of the present invention will be described with reference to the drawings. The structure of an optical device 600 according to the second embodiment will be described using FIGS. 12A to 12D while referring to FIGS. 1 to 5. FIG. 12A is a plan view illustrating an exemplary structure of the optical device 600, and FIG. 12B is a cross-sectional view illustrating the exemplary structure of the optical device 600 and taken along line XB-XB of FIG. 12A. Additionally, FIG. 12C is a bottom surface view illustrating the exemplary structure of the optical device 600, and FIG. 12D is a schematic view illustrating the arrangement and structure of each component of a sensor block 650 as seen from the bottom surface.

(Structure of Optical Device)

The optical device 600 includes the lens block 10, the sensor block 650, and an IC block 610 electrically coupled to the sensor block 650, as illustrated in FIGS. 12A to 12D. In the optical device 600, the lens block 10, the sensor block 650, and the IC block 610 are arranged in layers. The lens block 10 and the sensor block 650 are connected by the connection member 1 comprising, for example, a thermosetting resin or the like. Additionally, the sensor block 650 and the IC block 610 are connected by a conductive paste 2. The sensor block 650 and the IC block 610 are also electrically coupled to each other. In the optical device 600, the sensor block 650 outputs a signal corresponding to light (infrared light) entering the photoelectric conversion chip 60, and the IC block 610 performs signal processing of the signal output from the sensor block 650. The signal processed by the IC block 610 is output to an unillustrated circuit board connected to the IC block 610.

Hereinafter, a description will be given of each component forming the optical device 600.

(Lens Block)

The lens block 10 has the same structure as that of the lens block 10 of the optical device 100 according to the first embodiment, and thus, the description thereof will be omitted.

(Sensor Block)

The sensor block 650 includes the photoelectric conversion chip 60, a plurality of connection terminals 670 arranged around the photoelectric conversion chip 60, the plurality of conductors 80 configured to electrically couple the photoelectric conversion chip 60 and the connection terminals 670, and the sealing portion 90 configured to cover side faces and a bottom surface of the photoelectric conversion chip 60 to expose the light receiving surface 60*a* of the photoelectric conversion chip 60. The sensor block 650 has the same structure as that of the sensor block 50 of the optical device 100 according to the first embodiment except for including the connection terminals 670 having a shape connectable to the IC block 610 instead of the external connection terminals 70. Thus, the description of each component other than the connection terminals 670 will be omitted.

The connection terminals 670 are arranged to be exposed from the sealing portion 90 on at least an IC block 610 side surface of the sensor block 650 so as to be electrically coupled to the IC block 610. In the present embodiment, as illustrated in FIG. 12D, four each of 16 connection terminals 670*a* to 670*p* as the connection terminals 670 are placed side by side on each side of the sensor block 650 having a rectangular shape, and arranged in such a manner as to surround the photoelectric conversion chip 60. FIG. 12D is a bottom surface view of the sensor block 650 illustrated omitting the sealing portion 90. The connection terminals 670 are formed of, for example, copper (Cu), and preferably, external surfaces thereof are multilayer plated by plating nickel (Ni), palladium (Pd), and gold (Au) in order thereon or plated with tin (Sn).

As illustrated in FIG. 12D, the connection terminals 670 are exposed from the sealing portion 90 in the vicinity of an outer periphery of the bottom surface of the sensor block 650. Additionally, a part of each of the connection terminals 670 on the bottom surface side of the sensor block 650 is half-etched to be thin in thickness. In FIG. 12D, the half-etched parts of the external connection terminals 670 are indicated by oblique lines. The conductors 80 are connected to half-etched parts of the external connection terminals 670 that are near the photoelectric conversion chip 60. The sensor block 650 of the present embodiment represents an example where eight conductors 80 connected to eight terminals 64 of the photoelectric conversion chip 60 are connected to eight external connection terminals 670 (670*c* to 670*j*). In other words, terminals serving as substantially those for external connection in the sensor block 650 are the external connection terminals 670*c* to 670*j*. Note that while the half-etched parts are formed on the parts of the connection terminals 670 near the photoelectric conversion chip 60 and the parts thereof near the side faces of the sensor block 650 in FIG. 12D, regions for forming half-etched parts are not limited thereto. It is sufficient that non-etched parts of the connection terminals 670 exposed from the sensor block 650 are formed at positions facing connection vias 640 of the IC block.

(IC Block)

The IC block 610 includes a chip-shaped signal processing IC 620, a rewiring layer 630 electrically coupled to the signal processing IC 620, and the connection vias 640 electrically coupled the sensor block 650 and the signal processing IC 620. Additionally, the IC block 610 includes a sealing portion 660 sealing the signal processing IC 620, one surface of the rewiring layer 630, and side faces of the connection vias 640 and external connection terminals 680 electrically coupled to the rewiring layer 630.

(Signal Processing IC)

An upper surface and side faces of the signal processing IC 620 are covered by the sealing portion 660, and a bottom surface thereof is in contact with the rewiring layer 630. The signal processing IC 620 is electrically coupled to the sensor block 650 via the rewiring layer 630 and the connection vias 640, and includes circuits such as a detection circuit for detecting a signal of current, voltage, or the like from the photoelectric conversion chip 60 of the sensor block 650 and a signal processing circuit for processing the signal. Additionally, the signal processing IC 620 is electrically coupled to the rewiring layer 630, and outputs the processed signal to an unillustrated circuit board via the rewiring layer 630 and the external connection terminals 680.

(Rewiring Layer)

The rewiring layer 630 is formed on lower surfaces of the signal processing IC 620 and the sealing portion 660. The rewiring layer 630 includes one or a plurality of insulating layers, rewiring lines electrically coupled to the single processing IC 620 and provided on the one insulating layer or between the plurality of insulating layers, and pads (unillustrated) for providing the external connection terminals 680 that are electrically coupled to the rewiring lines. The rewiring layer 630 is formed by an ordinary process, and can be of any structure as long as the connection vias 640 and the signal processing IC 620, and the signal processing IC 620 and the external connection terminals 680 are connected by the rewiring lines.

The one or plurality of insulating layers are formed of a material that is small in warpage, excellent in bondability to the rewiring lines, and highly heat-resistant, and specifically, are formed of a resin material such as polyimide. The rewiring lines include, for example, a base layer and a conductor layer. The base layer is formed by, for example, electroless plating or sputtering. The base layer is formed of, for example, copper (Cu). The conductor layer is formed by electroplating the base layer as an electrode. The conductor layer is formed of, for example, copper (Cu).

The pads are provided to connect the external connection terminals 680 to the rewiring lines, and formed of, for example, a laminated film including, for example, an Ni layer and an Au layer.

(Sealing Portion)

The sealing portion 660 is formed of a resin material, and covers an upper surface and side faces of the signal processing IC 620. Additionally, by covering the upper surface and side faces of the signal processing IC 620 with the sealing portion 660, a lower surface of the signal processing IC 620 is exposed to the rewiring layer 630. In addition, resin of the upper surface side of the signal processing IC 620 may be cut by polishing to expose the upper surface of the signal processing IC 620. Exposing the upper surface of the signal processing IC 620 allows the signal processing IC 620 to be structured so as to be hardly influenced by stress of the resin material of the sealing portion 660.

The sealing portion 660 is formed of the same material as that of the sealing portion 90.

(Connection Vias)

As illustrated in FIG. 12B, each connection via 640 is a through mold via (TMV) formed by embedding a conductor such as, for example, copper (Cu) in a through hole 662 penetrating through the sealing portion 660. The connection vias 640 are formed at positions facing the non-etched parts of the connection terminals 670 of the sensor block 650. The connection vias 640 are formed as follows: in the sealing portion 660 having the rewiring layer 630 formed on the lower surface thereof are provided the through holes 662 penetrating from an upper surface of the sealing portion 660 to the lower surface of the sealing portion 660 facing the rewiring layer 630; and a copper (Cu) filled layer is formed in each of the through holes 662 by electroplating or the like.

(External Connection Terminals)

The external connection terminals 680 are in contact with the pads of the rewiring layer 630, and electrically coupled to the signal processing IC 620. The external connection terminals 680 are, for example, solder balls. When mounting the optical device 600 on the unillustrated circuit board, each of the external connection terminals 680 is arranged to contact with predetermined positions on the circuit board. After this, through a reflow process, the external connection terminals 680 are heated and then cooled to solder together the optical device 600 and the circuit board.

Effect of Second Embodiment

The optical device 600 according to the second embodiment provides, in addition to the effects (1) and (2) in the first embodiment, the following effect:

(1) In the optical device 600 of the present embodiment, the lens block 10, the sensor block 650, and the IC block 610 are layered together. Thus, there can be obtained the optical device 600 small in size while comprising the IC block 610 including circuits such as a detection circuit and a signal processing circuit.

3. Third Embodiment

Figure 13A:
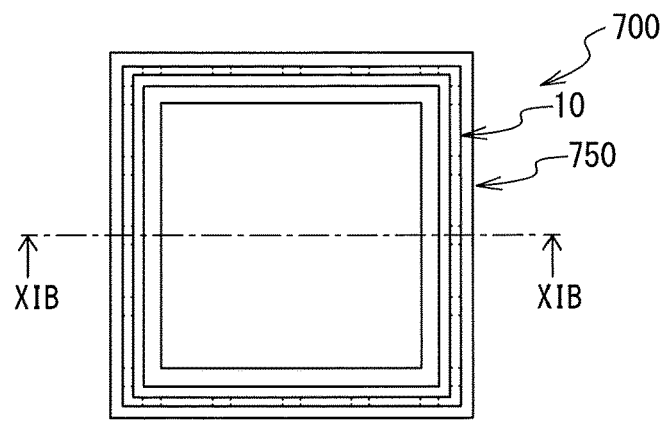
FIGS. 13A to 13D illustrate schematic views of an exemplary structure of an optical device according to a third embodiment of the present invention.
Figure 13B:
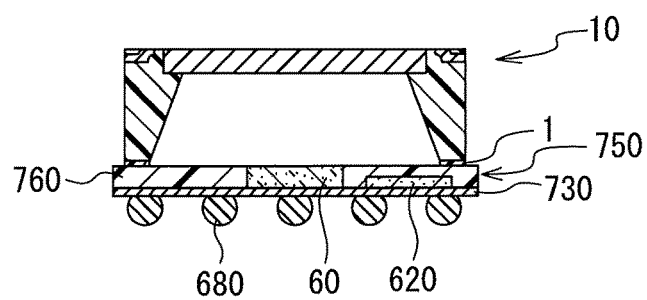
Figure 13C:
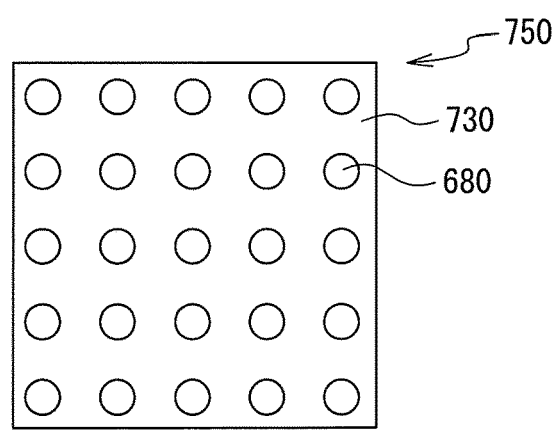
Figure 13D:
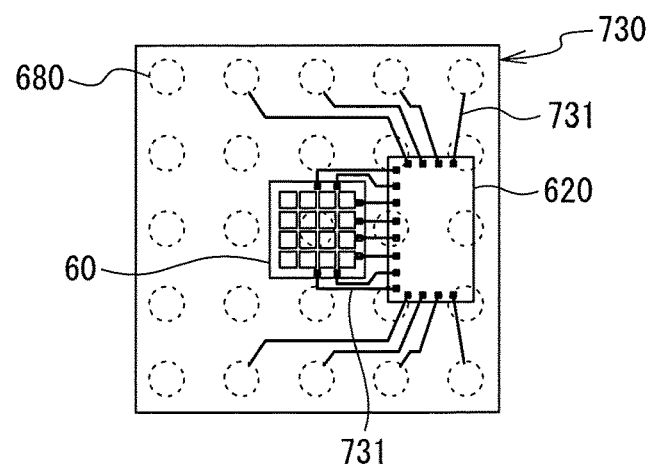

Hereinafter, a third embodiment of the present invention will be described with reference to the drawings. The structure of an optical device 700 according to the third embodiment will be described using FIGS. 13A to 13D while referring to FIGS. 1 to 5 and FIGS. 12A to 12D. FIG. 13A is a plan view illustrating an exemplary structure of the optical device 700, and FIG. 13B is a cross-sectional view illustrating the exemplary structure of the optical device 700 and taken along line XIB-XIB of FIG. 13A. Additionally, FIG. 13C is a bottom surface view illustrating the exemplary structure of the optical device 700, and FIG. 13D is a schematic view illustrating the arrangement and structure of each component of a sensor block 750 as seen from the bottom surface, in which the schematic view illustrates rewiring lines 731 of a rewiring layer 730 and the bottom surface of the sensor block 750 in a transparent state of the rewiring layer 730.

(Structure of Optical Device)

As illustrated in FIGS. 13A to 13D, the optical device 700 includes the lens block 10 and the sensor block 750 including the photoelectric conversion chip 60 and the signal processing IC 620. In the optical device 700, the lens block 10 and the sensor block 750 are arranged in layers. The lens block 10 and the sensor block 750 are connected by the connection member 1 comprising, for example, a thermosetting resin or the like. In the optical device 700, a signal corresponding to light (infrared light) entering the photoelectric conversion chip 60 of the sensor block 750 is output to the signal processing IC 620, and the signal processing IC 620 performs signal processing of the signal output from the photoelectric conversion chip 60. The signal processed by the signal processing IC 620 is output to an unillustrated circuit board electrically coupled to the signal processing IC 620. In other words, the optical device 700 is different in that it includes the sensor block 750 instead of the sensor block 50 of the first embodiment. Thus, the description of block structures other than the sensor block 750 will be omitted.

(Sensor Block)

The sensor block 750 includes the photoelectric conversion chip 60, the signal processing IC 620, and the rewiring layer 730 electrically coupled to the signal processing IC 620. Additionally, the sensor block 750 includes a sealing portion 760 sealing the photoelectric conversion chip 60, the signal processing IC 620, and one surface of the rewiring layer 730 and the external connection terminals 680 electrically coupled to the signal processing IC 620. In other words, the sensor block 750 is structured so that the IC block 610 of the second embodiment further includes the photoelectric conversion chip 60, and the connection vias 640 are removed.

(Photoelectric Conversion Chip)

The photoelectric conversion chip 60 is the same in structure as the photoelectric conversion chip 60 of the sensor block 50 included in the optical device 100 according to the first embodiment, and thus the description thereof will be omitted.

(Signal Processing IC)

The signal processing IC 620 is the same in structure as the signal processing IC 620 of the IC block 610 included in the optical device 600 according to the second embodiment. Thus, the description thereof will be omitted.

(Rewiring Layer)

The rewiring layer 730 is substantially the same in structure as the rewiring layer 630 of the IC block 610 included in the optical device 600 according to the second embodiment. As illustrated in FIG. 13D, the rewiring layer 730 is different from the rewiring layer 630 in that the rewiring lines 731 electrically couple the photoelectric conversion chip 60 and the signal processing IC 620 instead of electrically coupling the connection vias 640 and the signal processing IC 620.

(Sealing Portion)

The sealing portion 760 is formed of a resin material, and covers the side faces of the photoelectric conversion chip 60 and the upper surface and side faces of the signal processing IC 620. Additionally, by covering the side faces of the photoelectric conversion chip 60 with the sealing portion 760, the lower surface of the photoelectric conversion chip 60 is exposed to the rewiring layer 730. In addition, the sealing portion 760 may expose the upper surface of the signal processing IC 620, like the photoelectric conversion chip 60. Exposing the upper surface of the signal processing IC 620 allows the signal processing IC 620 to be structured so as to be hardly influenced by stress of the resin material of the sealing portion 760.

The sealing portion 760 is formed of the same material as that of the sealing portion 90.

Effects of Third Embodiment

The optical device 700 according to the third embodiment provides, in addition to the effects (1) and (2) in the first embodiment, the following effect:

(1) In the optical device 700 of the present embodiment, the lens block 10 and the sensor block 750 including the photoelectric conversion chip 60 and the signal processing IC 620 are layered together. Thus, there can be obtained the optical device 700 thin in thickness while comprising the signal processing IC 620 including circuits such as a detection circuit and a signal processing circuit.

4. Fourth Embodiment

Figure 14A:
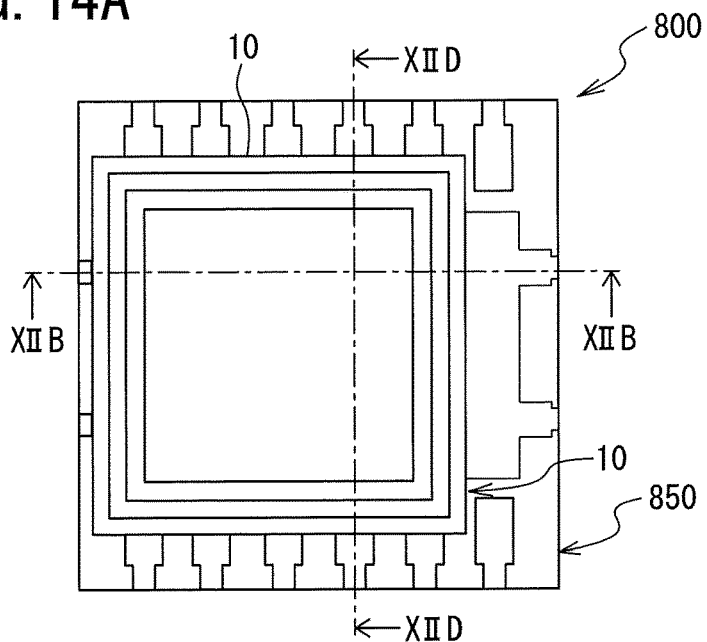
FIGS. 14A to 14D illustrate schematic views of an exemplary structure of an optical device according to a fourth embodiment of the present invention.
Figure 14D:
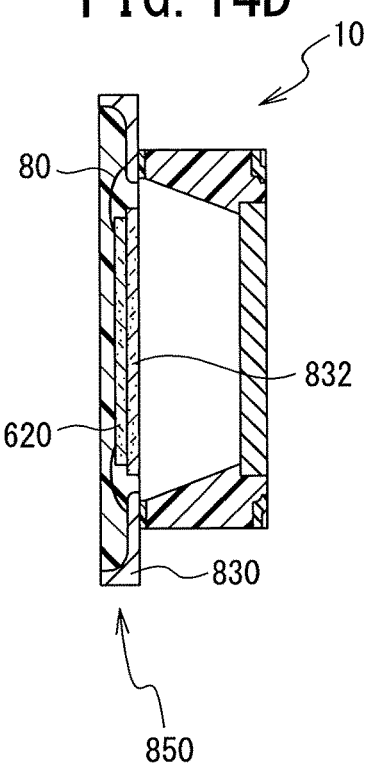
Figure 14B:
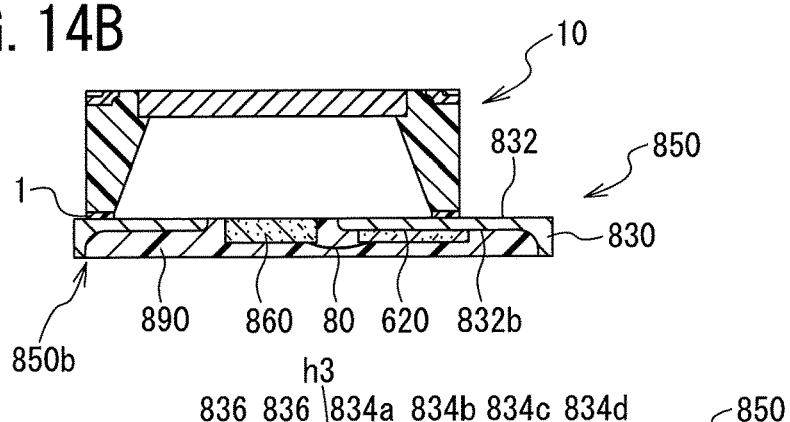
Figure 14C:
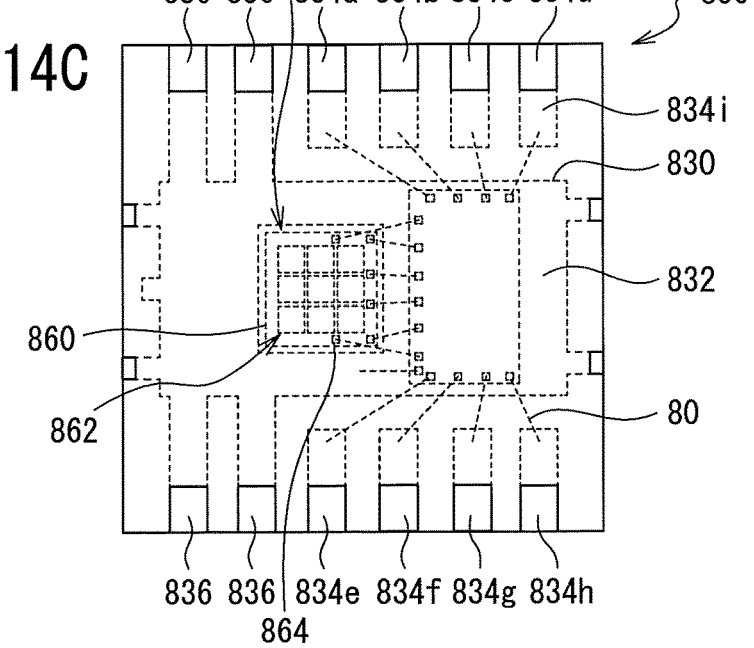

Hereinafter, a fourth embodiment of the present invention will be described with reference to the drawings. The structure of an optical device 800 according to the fourth embodiment will be described using FIGS. 14A and 14B while referring to FIGS. 1 to 5, FIGS. 12A to 12D, and FIGS. 13A to 13D. FIG. 14A is a plan view illustrating an exemplary structure of the optical device 800, and FIG. 14B is a cross-sectional view illustrating the exemplary structure of the optical device 800 and taken along line XIIB-XIIB of FIG. 14A. Additionally, FIG. 14C is a bottom surface view illustrating the exemplary structure of the optical device 800, and FIG. 14D is a cross-sectional view illustrating the exemplary structure of the optical device 800 and taken along line XIID-XIID of FIG. 14A.

(Structure of Optical Device)

The optical device 800 includes the lens block 10 and a sensor block 850 including a photoelectric conversion chip 860 and the signal processing IC 620, as illustrated in FIGS. 14A to 14D. In the optical device 800, the lens block 10 and the sensor block 850 are arranged in layers. The lens block 10 and the sensor block 850 are connected by the connection member 1 comprising, for example, a thermosetting resin or the like. In the optical device 800, a signal corresponding to light (infrared light) entering the photoelectric conversion chip 860 of the sensor block 850 is output to the signal processing IC 620, and the signal processing IC 620 performs signal processing of the signal output from the photoelectric conversion chip 860. The signal processed by the signal processing IC 620 is output to an unillustrated circuit board electrically coupled to the signal processing IC 620. In other words, the optical device 800 is different in that it includes the sensor block 850 instead of the sensor block 50 of the first embodiment. Thus, the description of block structures other than the sensor block 850 will be omitted.

(Sensor Block)

The sensor block 850 includes the photoelectric conversion chip 860 and the signal processing IC 620 electrically coupled to the photoelectric conversion chip 860 and arranged on a lead frame 830. Additionally, the sensor block 850 includes a sealing portion 890 sealing the photoelectric conversion chip 860, the signal processing IC 620, and a part of the lead frame 830. In other words, the sensor block 850 is structured so that the sensor block 50 of the first embodiment further includes the signal processing IC 620, and includes the lead frame 830 including the external connection terminals 834, instead of the external connection terminals 70.

(Photoelectric Conversion Chip)

The photoelectric conversion chip 860 is an array sensor including one or a plurality of photoelectric conversion elements 862 arranged in a matrix in a plan view, in which the one or plurality of photoelectric conversion elements 862 is, for example, one or a plurality of infrared light receiving elements. As illustrated in FIG. 14C, the photoelectric conversion chip 860 of the present embodiment represents an example where nine photoelectric conversion chips 862 are arranged in three rows by three columns. In addition, the photoelectric conversion chip 860 includes a plurality of terminals 864 as output terminals of the photoelectric conversion elements 862. As illustrated in FIG. 14C, the photoelectric conversion chip 860 of the present embodiment includes six terminals 864. The terminals 864 are electrically coupled to the signal processing IC 620 by the conductors 80.

(Signal Processing IC)

The signal processing IC 620 is the same in structure as the signal processing IC 620 of the IC block 610 included in the optical device 600 of the second embodiment, except that the signal processing IC 620 is connected to the photoelectric conversion chip 860 by the conductors 80. Thus, the description thereof will be omitted.

(Lead Frame)

The lead frame 830 is formed of, for example, copper (Cu), and formed by forming a multilayer plating film by plating with nickel (Ni), palladium (Pd), and gold (Au) in order. As illustrated in FIG. 14C, the lead frame 830 includes a through opening h3 and a die pad 832. The die pad 832 is formed by half-etching a part thereof from a lower surface 832b side of the die pad 832 by using a photolithographic technology. The signal processing IC 620 is attached onto the lower surface 832b of the die pad 832. The photoelectric conversion chip 860 is arranged in the opening h3 of the lead frame 830. Additionally, the lead frame 830 includes a plurality of external connection terminals 834. The present embodiment illustrates an example including eight external connection terminals 834 (834a to 834h) provided away from the die pad 832.

The external connection terminals 834 of the lead frame 830 include half-etched parts and non-etched parts. The half-etched parts are formed by half-etching from lower surfaces 834i of the external connection terminals 834, and the conductors 80 connected to the signal processing IC 620 are connected to the half-etched parts. The non-etched parts of the external connection terminals 834 are exposed from a lower surface 850b of the sensor block 850, and connected to an unillustrated circuit board. In addition, even on portions other than the external connection terminals 834, the lead frame 830 includes non-etched parts 836 exposed from the lower surface 850b of the sensor block 850, as illustrated in FIG. 14D. The non-etched parts 836 are formed connecting to the die pad 832 mounted with the signal processing IC 620. The non-etched parts 836 are solder-connected to the unillustrated circuit board by surface-mounting, and thereby serve to release heat generated in the signal processing IC 620 to the circuit board.

Effects of Fourth Embodiment

The optical device 800 according to the fourth embodiment provides, in addition to the effects (1) and (2) in the first embodiment, the following effects:

(1) In the optical device 800 of the present embodiment, the lens block 10 and the sensor block 850 including the photoelectric conversion chip 860 and the signal processing IC 620 are layered together. Thus, there can be obtained the optical device 800 thin in thickness while comprising the signal processing IC 620 including circuits such as a detection circuit and a signal processing circuit.

(2) Additionally, in the optical device 800 of the present embodiment, the signal processing IC 620 is arranged on the lead frame 830 formed of copper (Cu) or the like. Thus, heat generated in the signal processing IC 620 can be released via the lead frame 830.

The scope of the present invention is not limited to the illustrated and described exemplary embodiments, and includes all embodiments that provide effects equivalent to the object of the present invention. Furthermore, the scope of the present invention is not limited to combinations of features of the present invention defined by appended claims, and can be defined by any other desired combination of specific features of all disclosed individual features.

REFERENCE SIGNS LIST

1: Connection member
2: Conductive paste
10, 210, 310, 410, 510: Lens block
12, 212, 312, 512: Recessed portion
20, 220, 320, 420, 520: Lens
30, 90, 230, 330, 430, 530, 660, 760, 890: Sealing portion
32: Inner wall
40: Frame material
42: Annular portion
44: Connection portion
50, 650, 750, 850: Sensor block
60, 860: Photoelectric conversion chip
60a: Light receiving surface
62, 862: Photoelectric conversion element
64, 864: Terminal
70, 70a to 70p, 270, 680, 834, 834a to 834h: External connection terminal
80: Conductor
100, 600, 700, 800: Optical device
332, 432: Grooved portion
610: IC block
630, 730: Rewiring layer
640: Connection via
662: Through hole
670, 670a to 670p: Connection terminal
830: Lead frame
832: Die pad
836: Non-etched part

The invention claimed is:

1. An optical device, comprising:
a photoelectric conversion block including a photoelectric conversion chip configured to include one photoelectric conversion element or a plurality of photoelectric conversion elements arranged in a matrix and a first sealing member configured to cover side faces of the photoelectric conversion chip to expose the photoelectric conversion chip; and
a lens block including a lens and a second sealing member configured to cover side faces of the lens to expose one surface and an other surface of the lens,
wherein the lens block includes a recessed portion formed by the one surface of the lens and the second sealing member, at least a part of a bottom surface of the recessed portion being formed by the one surface of the lens, a sidewall of the recessed portion being formed by the second sealing member, and the recessed portion being arranged in such a manner as to cover the photoelectric conversion chip exposed from the first sealing member, and
wherein the lens block includes a frame member including an opening, the side faces of the lens and the frame member being covered with the second sealing member in a state where the lens is arranged in the opening.

2. The optical device according to claim 1, wherein the bottom surface of the recessed portion has a circular shape, and an entire surface of the bottom surface of the recessed portion is formed by the one surface of the lens.

3. The optical device according to claim 2, wherein the entire surface of the bottom surface is formed by the one surface of the lens, and in a vicinity of the lens, an inner wall of a sidewall portion of the second sealing member located on a lateral side of the recessed portion protrudes or is recessed curvedly with respect to the recessed portion in a cross-sectional view.

4. The optical device according to claim 3, wherein a surface of the sidewall portion facing the photoelectric conversion block and the inner wall of the sidewall portion are continued by a curved surface.

5. The optical device according to claim 1, wherein the bottom surface of the recessed portion has a circular or rectangular shape, and the lens has a rectangular shape, the bottom surface of the recessed portion being formed by the one surface of the lens and the second sealing member.

6. The optical device according to claim 5, wherein the rectangular lens is arranged at a predetermined distance from an outer periphery of the bottom surface of the recessed portion in a plan view.

7. The optical device according to claim 5, wherein the second sealing member includes a grooved portion around the one surface of the lens.

8. The optical device according to claim 1, wherein the inner wall of the sidewall portion is inclined with respect to the bottom surface of the recessed portion such that an area of an opening surface of the recessed portion becomes larger than an area of the bottom surface of the recessed portion.

9. The optical device according to claim 1, comprising a connection member configured to connect the photoelectric conversion block and the lens block, the connection member being provided outside a region of the photoelectric conversion block in which the photoelectric conversion chip is exposed.

10. The optical device according to claim 9, wherein the connection member is provided at a part of a surface of the photoelectric conversion block facing the lens block, which is a part in a circumferential direction of the facing surface to connect the photoelectric conversion block and the lens block with a gap formed between the photoelectric conversion block and the lens block.

11. The optical device according to claim 1, wherein the lens is a Fresnel lens or a binary lens.

12. The optical device according to claim 1 wherein the one photoelectric conversion element or the plurality of photoelectric conversion elements are light receiving elements or light emitting elements.

13. An optical device, comprising:
a photoelectric conversion block including a photoelectric conversion chip configured to include one photoelectric conversion element or a plurality of photoelectric conversion elements arranged in a matrix and a first sealing member configured to cover side faces of the photoelectric conversion chip to expose the photoelectric conversion chip; and a lens block including a lens and a second sealing member configured to cover side faces of the lens to expose one surface and an other surface of the lens, wherein the lens block includes a recessed portion formed by the one surface of the lens and the second sealing member, at least a part of a bottom surface of the recessed portion being formed by the one surface of the lens, a sidewall of the recessed portion being formed by the second sealing member, and the recessed portion being arranged in such a manner as to cover the photoelectric conversion chip exposed from the first sealing member, wherein the photoelectric conversion block includes a plurality of external terminals partially exposed from the first sealing member, and wherein the photoelectric conversion chip includes a terminal portion serving as terminals of the plurality of photoelectric conversion elements, the terminal portion being electrically coupled to any of the external terminals.

14. An optical device, comprising:

a photoelectric conversion block including a photoelectric conversion chip configured to include one photoelectric conversion element or a plurality of photoelectric conversion elements arranged in a matrix and a first sealing member configured to cover side faces of the photoelectric conversion chip to expose the photoelectric conversion chip; and a lens block including a lens and a second sealing member configured to cover side faces of the lens to expose one surface and an other surface of the lens, wherein the lens block includes a recessed portion formed by the one surface of the lens and the second sealing member, at least a part of a bottom surface of the recessed portion being formed by the one surface of the lens, a sidewall of the recessed portion being formed by the second sealing member, and the recessed portion being arranged in such a manner as to cover the photoelectric conversion chip exposed from the first sealing member, wherein the photoelectric conversion block includes an IC chip electrically coupled to the photoelectric conversion chip, the IC chip being covered with the first sealing member, and wherein the photoelectric conversion block includes a rewiring layer formed on a surface of the photoelectric conversion block opposite to the lens block, and the IC chip is electrically coupled to the photoelectric conversion chip by the rewiring layer, side faces or the side faces and an upper surface of the IC chip being covered with the first sealing member.

15. An optical device, comprising:

a photoelectric conversion block including a photoelectric conversion chip configured to include one photoelectric conversion element or a plurality of photoelectric conversion elements arranged in a matrix and a first sealing member configured to cover side faces of the photoelectric conversion chip to expose the photoelectric conversion chip;

a lens block including a lens and a second sealing member configured to cover side faces of the lens to expose one surface and an other surface of the lens, wherein the lens block includes a recessed portion formed by the one surface of the lens and the second sealing member, at least a part of a bottom surface of the recessed portion being formed by the one surface of the lens, a sidewall of the recessed portion being formed by the second sealing member, and the recessed portion being arranged in such a manner as to cover the photoelectric conversion chip exposed from the first sealing member;

an IC block including an IC chip;

a third sealing member configured to cover and seal side faces or the side faces and an upper surface of the IC chip; and a conductor whose side face is covered and sealed with the third sealing member and which is electrically coupled to the IC chip, the conductor being exposed on a surface of the IC block facing the photoelectric conversion block, and being electrically coupled to the photoelectric conversion block.

16. The optical device according to claim 15, wherein the photoelectric conversion block includes a connection terminal electrically coupled to the photoelectric conversion chip and exposed on a surface of the photoelectric conversion block facing the IC block, the connection terminal being electrically coupled to the conductor of the IC block.

17. The optical device according to claim 15, wherein the IC block includes the rewiring layer formed on a surface of the IC chip opposite to the photoelectric conversion block, and the conductor penetrates through the third sealing member from a surface facing the photoelectric conversion block to a surface opposite to the photoelectric conversion block, and is electrically coupled to the rewiring layer.

* * * * *